United States Patent
Nakamura et al.

(10) Patent No.: US 12,349,390 B2
(45) Date of Patent: Jul. 1, 2025

(54) SEMICONDUCTOR DEVICE

(71) Applicant: Mitsubishi Electric Corporation, Tokyo (JP)

(72) Inventors: Marika Nakamura, Tokyo (JP); Shigeyoshi Usami, Tokyo (JP); Yuki Takiguchi, Tokyo (JP); Takahiro Yamada, Tokyo (JP); Hisashi Saito, Tokyo (JP); Tatsuro Watahiki, Tokyo (JP); Eiji Yagyu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 481 days.

(21) Appl. No.: 17/918,577

(22) PCT Filed: May 21, 2021

(86) PCT No.: PCT/JP2021/019358
§ 371 (c)(1),
(2) Date: Oct. 13, 2022

(87) PCT Pub. No.: WO2021/246202
PCT Pub. Date: Dec. 9, 2021

(65) Prior Publication Data
US 2023/0143585 A1     May 11, 2023

(30) Foreign Application Priority Data
Jun. 4, 2020   (JP) .................................. 2020-097551

(51) Int. Cl.
*H10D 30/47*       (2025.01)
*H10D 62/824*     (2025.01)
(Continued)

(52) U.S. Cl.
CPC ......... *H10D 30/475* (2025.01); *H10D 62/824* (2025.01); *H10D 64/513* (2025.01); *H10D 64/64* (2025.01); *H10D 62/8503* (2025.01)

(58) Field of Classification Search
CPC .... H10D 64/513; H10D 64/64; H10D 30/475; H10D 62/824; H10D 62/8503; H10D 30/4755
See application file for complete search history.

(56) References Cited

U.S. PATENT DOCUMENTS

2013/0082277 A1*  4/2013  Park ................... H10D 30/4755
                                                                  257/76
2014/0264273 A1    9/2014  Howell et al.
(Continued)

FOREIGN PATENT DOCUMENTS

DE   102015100387 A1   7/2015
EP      0562783 A1      9/1993
(Continued)

OTHER PUBLICATIONS

Office Action issued Aug. 9, 2024 in German Patent Application No. 11 2021 003 124.4 with English translation thereof.
(Continued)

*Primary Examiner* — Peter M Albrecht
(74) *Attorney, Agent, or Firm* — XSENSUS LLP

(57) ABSTRACT

A first nitride semiconductor layer and a second nitride semiconductor layer are laminated in a first direction. The first and second nitride semiconductor layers form a heterojunction, and a two-dimensional carrier gas is induced in the first nitride semiconductor layer. A drain electrode is opposite to a source electrode via gate electrode in a third direction. The source electrode and the drain electrode conduct with the first nitride semiconductor layer. The first and second nitride semiconductor layers form a Schottky junction with the gate electrode. A first layer is located
(Continued)

between the gate electrode and the drain electrode in the third direction and is in contact with the gate electrode, and is in contact with the second nitride semiconductor layer in a second direction. The first layer suppresses induction of the two-dimensional carrier gas in the first nitride semiconductor layer opposite to the first layer in the first direction.

20 Claims, 29 Drawing Sheets

(51) Int. Cl.
  *H10D 62/85* (2025.01)
  *H10D 64/27* (2025.01)
  *H10D 64/64* (2025.01)

(56) References Cited

U.S. PATENT DOCUMENTS

| | | |
|---|---|---|
| 2015/0255590 A1 | 9/2015 | Ostermaier et al. |
| 2019/0013386 A1 | 1/2019 | Shinohara et al. |
| 2019/0229208 A1 | 7/2019 | Matioli et al. |
| 2021/0167202 A1* | 6/2021 | Lu .................. H10D 30/475 |
| 2022/0190151 A1* | 6/2022 | Ozaki ............... H10D 30/475 |

FOREIGN PATENT DOCUMENTS

| | | |
|---|---|---|
| JP | 5-275436 A | 10/1993 |
| JP | 2009-212291 A | 9/2009 |
| JP | 2016-512927 A | 5/2016 |
| JP | 2020-526921 A | 8/2020 |
| WO | 2014/152490 A1 | 9/2014 |
| WO | 2019/010313 A1 | 1/2019 |

OTHER PUBLICATIONS

International Search Report and Written Opinion mailed on Jul. 27, 2021, received for PCT Application PCT/JP2021/019358, filed on May 21, 2021, 9 pages including English Translation.

Shinohara et al., "GaN-Based Field-Effect Transistors With Laterally Gated Two-Dimensional Electron Gas", IEEE Electron Device Letters, vol. 39, No. 3, Mar. 2018, pp. 417-420.

* cited by examiner

F I G. 1
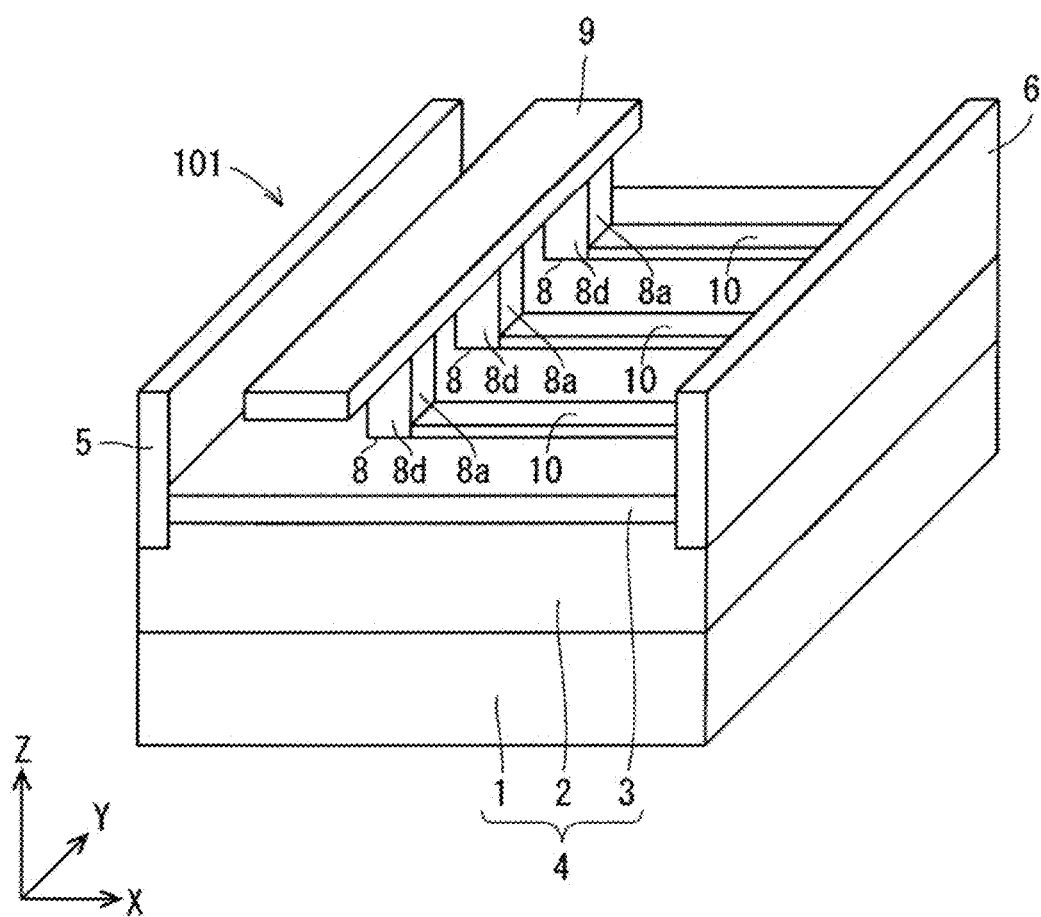

F I G. 5
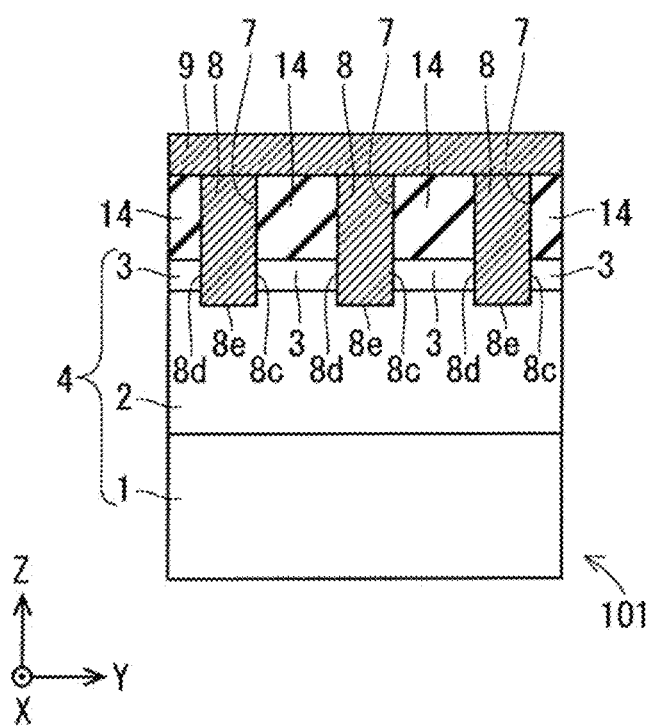

F I G. 1 3
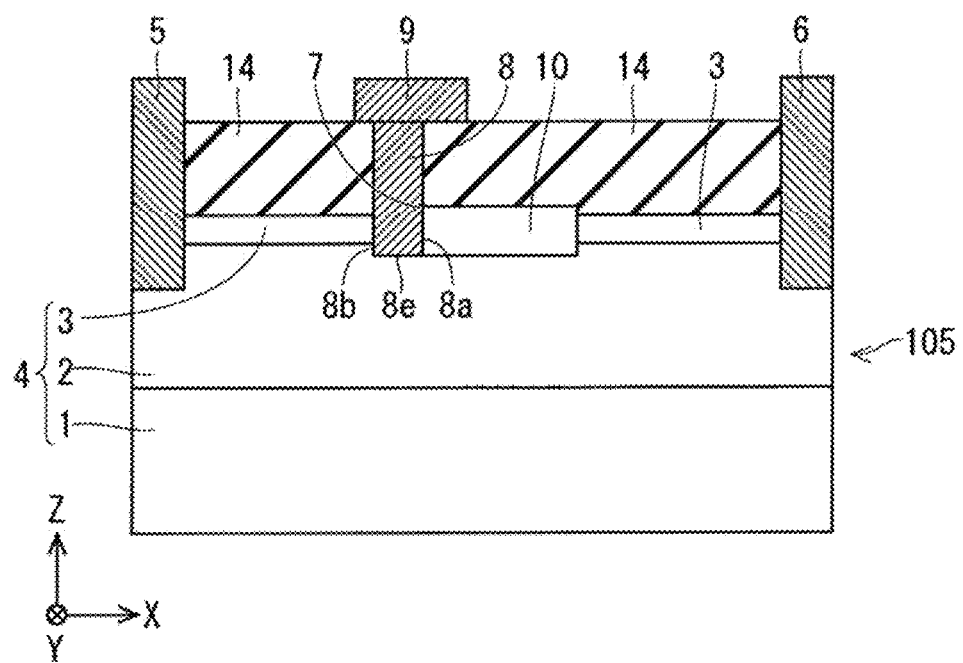

F I G. 1 5
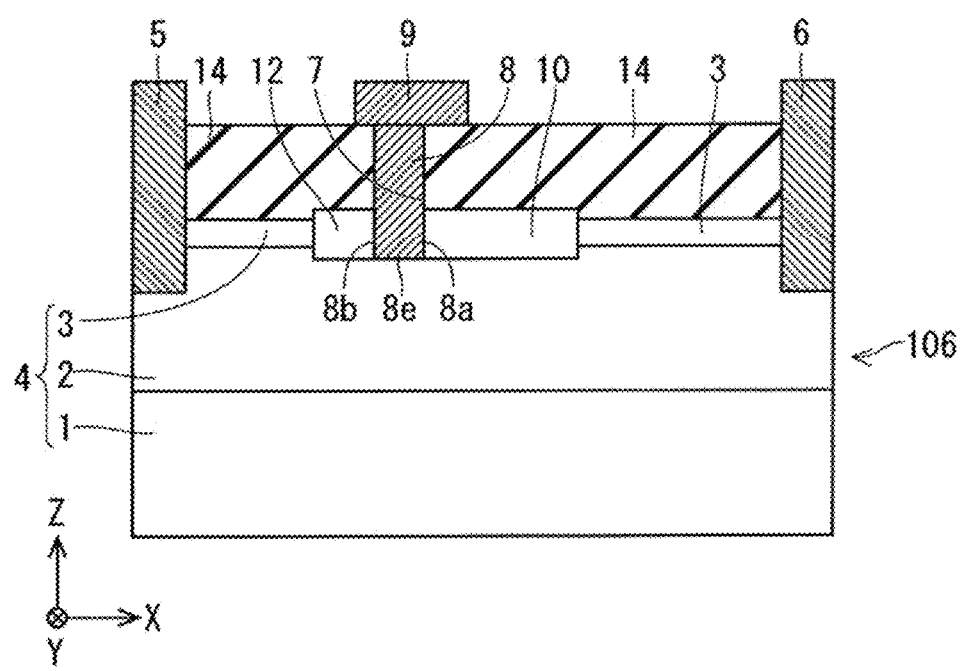

F I G. 2 0
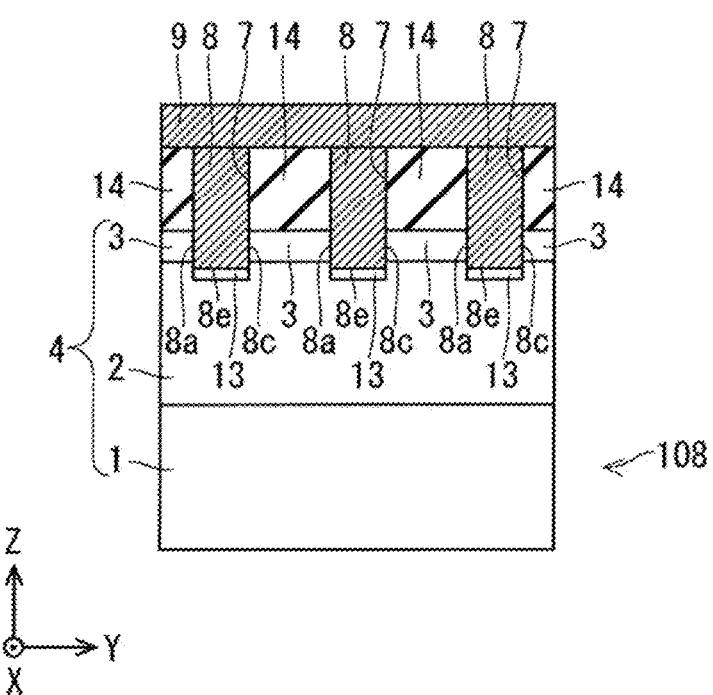

SEMICONDUCTOR DEVICE

CROSS-REFERENCE TO RELATED APPLICATIONS

The present application is based on PCT filing PCT/JP2021/019358, filed May 21, 2021, which claims priority to JP 2020-097551, filed Jun. 4, 2020, the entire contents of which is incorporated herein by reference.

TECHNICAL FIELD

The present disclosure relates to a semiconductor device.

BACKGROUND ART

A high-output semiconductor device operating at a high frequency is adopted for a communication system using wireless communication, for example, satellite communication. A transistor using a nitride semiconductor is adopted as the semiconductor device, which enhances the performance of the semiconductor device.

In the transistor using a nitride semiconductor, two types of compound semiconductors having different band gaps form a heterojunction. A two-dimensional carrier gas (2DCG) is induced at the heterojunction interface (hereinafter referred to as "hetero interface"). The two-dimensional carrier gas is a general name for the two-dimensional electron gas (2DEG) and: the two-dimensional hole gas (2DHG).

A high electron mobility transistor (hereinafter referred to as "HEMT") uses the two-dimensional carrier gas. The HEMT has high output and operates at high frequencies.

In recent years, as the digitization of communication and the progress in bit rate, there is a demand for reduction in distortion of communication systems. In order to meet such a demand, it is necessary not only to apply a distortion compensation circuit but also to improve the linearity of HEMT per se.

The mutual conductance of the HEMT has a non-linearity that increases once with an increase in a drain current and then sharply decreases after reaching a peak value. Shortening the gate length of the HEMT for increasing the frequency increases the non-linearity. In order to solve the increase in non-linearity, various studies have been conducted using the techniques developed for semiconductor devices using silicon.

For example, Non-Patent Document 1 discloses a structure with reference to a multi-gate element. A similar structure is also disclosed in Patent Document 4. In the structure (hereinafter, tentatively referred to as "buried gate arrangement structure"), a plurality of gate electrodes each having a columnar shape are arranged and buried in one direction in an epitaxial layer forming the hetero interface. The plurality of gate electrodes are connected to each other at positions separated from the epitaxial layer. In the buried gate arrangement structure, a depleted layer spreads on the side surfaces and bottom surfaces of the buried gate electrodes, and the channels are closed in the epitaxial layer located between the buried gate electrodes.

For example, Patent Document 1, Patent Document 2, and Patent Document 3 disclose a structure in which a channel is narrowed (hereinafter, tentatively referred to as a "narrow channel structure"). In the narrow channel structure, a gate electrode is adhered and formed on an epitaxial layer processed into a fine wire form. In the narrow channel structure, the area where the epitaxial layer is in contact with the source electrode and the drain electrode is small, and the contact resistance is large. The length of the epitaxial layer in the direction connecting the drain electrode and the source electrode is shortened to reduce the contact resistance.

PRIOR ART DOCUMENTS

Patent Document(s)

[Patent Document 1] Japanese Patent Application Laid-Open No. 2009-212291
[Patent Document 2] Japanese Unexamined Patent Application Publication (Translation of PCT Application) No. 2016-512927
[Patent Document 3] Japanese Patent Application Laid-Open No. 5-275436
[Patent Document 4] Japanese Unexamined Patent Application Publication (Translation of PCT Application) No. 2020-526921

Non-Patent Document(s)

[Non-Patent Document 1] K. Shinohara et. al, "GaN-Based Field-Effect Transistors With Laterally Gated Two-Dimensional Electron Gas", IEEE Electron Device Lett. 39-3, 417, 2018.

SUMMARY

Problem to be Solved by the Invention

In a transistor having a gate electrode, it is desired that the concentration of the electric field (the electric field being concentrated) is relaxed in the vicinity of the gate electrode from the viewpoint of the breakdown voltage of the transistor. For example, a so-called field plate structure is used for the relaxation. The field plate structure is considered to increase the electrostatic capacitance between the gate electrode and the other electrodes (e.g., the gate-drain capacitance and the gate-source capacitance).

Means to Solve the Problem

According to the present disclosure, a semiconductor device includes a semiconductor layer group including a first nitride semiconductor layer and a second nitride semiconductor layer laminated in a first direction, a plurality of gate electrodes, each of which being in contact with the second nitride semiconductor layer in a second direction different from the first direction and is arranged along the second direction, a conductor electrically connecting the plurality of gate electrodes and located away from the semiconductor layer group, a source electrode opposite to the plurality of gate electrodes in a third direction different from both the first direction and the second direction and conducting with the first nitride semiconductor layer, a drain electrode opposite to the source electrode via the plurality of gate electrodes in the third direction and conducting with the first nitride semiconductor layer, and a first layer located between the plurality of gate electrodes and the drain electrode in the third direction and in contact with the plurality of gate electrodes, and in contact with the second nitride semiconductor layer in the second direction. The first nitride semiconductor layer and the second nitride semiconductor layer form a heterojunction, and a two-dimensional carrier gas is induced in the first nitride semiconductor layer. The first nitride semiconductor layer and the second nitride semiconductor layer form a Schottky junction with each of the plurality of gate electrodes. The first layer is any of an insulator, an intrinsic semiconductor, and a semiconductor having a conductivity type opposite to that of the second nitride semiconductor layer, and suppresses induction of the two-dimensional carrier gas in the first nitride semiconductor layer opposite to the first layer in the first direction.

Effects of the Invention

A semiconductor device having a high breakdown voltage is provided.

The objects, features, aspects, and advantages of the present disclosure will become more apparent from the following detailed description and the accompanying drawings.

BRIEF DESCRIPTION OF DRAWINGS

FIG. 1 is a perspective view illustrating a structure of a semiconductor device according to a first embodiment.

FIG. 5 is a cross-sectional view illustrating a cross section of the semiconductor device according to the first embodiment at the position CC of FIG. 2.

FIG. 13 is a cross-sectional view illustrating a cross section of the semiconductor device according to the fifth embodiment at the position AA of FIG. 12.

FIG. 15 is a cross-sectional view illustrating a cross section of the semiconductor device according to the sixth embodiment at the position AA of FIG. 14.

FIG. 20 is a cross-sectional view illustrating a cross section of the semiconductor device according to the eighth embodiment at the position CC of FIG. 18.

DESCRIPTION OF EMBODIMENT(S)

For any of the semiconductor devices illustrated in the following embodiments, the main part of the field effect transistor is illustrated. In addition to the following disclosure, the field effect transistor is used with an element isolation region, wiring connected to an electrode, and a via hole being formed. The illustrations in the following embodiments do not preclude that the semiconductor device according to the present disclosure is applied to an element other than a field effect transistor.

First Embodiment

[Structure and Operation]

FIG. 1 is a perspective view illustrating a structure of a semiconductor device 101 according to a first embodiment. The directions X, Y, and Z added in FIG. 1 are different from each other, and the plane parallel to both of the directions X and Y is unparalleled to the direction Z. In the disclosure, the case where the directions X, Y, and Z are orthogonal to each other is illustrated.

For convenience, a second element on a direction Z side when viewed from a first element is described as being above the first element. The first element is described as being below the second element. In the present disclosure, terms "upper" and "lower" are indicating the relative positional relationship of components, and are terms not necessarily based on the direction of gravity. FIG. 1 illustrates a cross section of the semiconductor device 101 perpendicular to the direction Y and a cross section perpendicular to the direction X.

In the following, the length along the direction X may be simply referred to as "length"'", the length along the direction Y may be referred to as "width", and the length along the direction Z may be referred to as "thickness".

Figure 2:
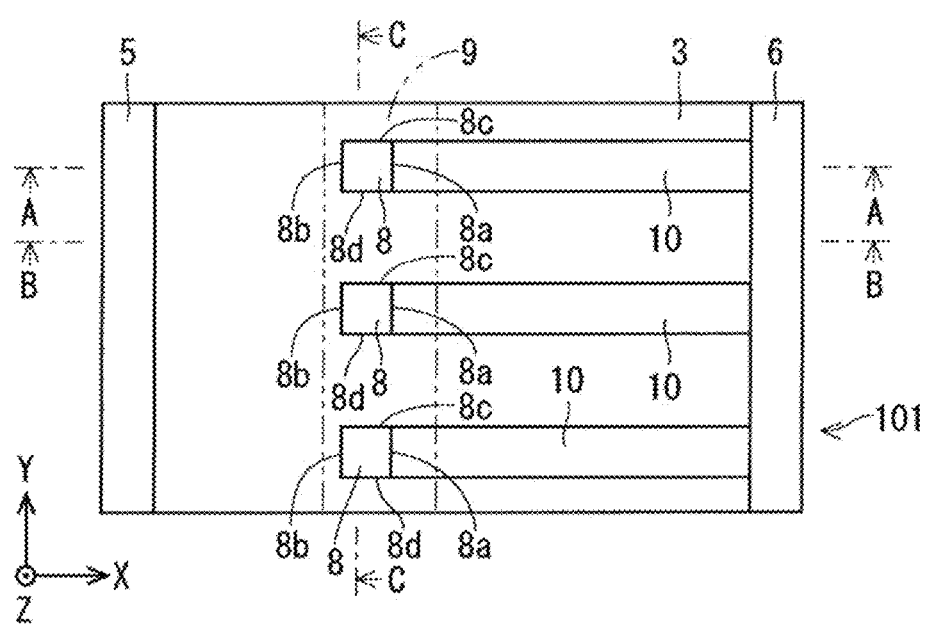
FIG. 2 is a plan view illustrating the structure of the semiconductor device according to the first embodiment.

FIG. 2 is a plan view illustrating a structure of the semiconductor device 101. FIG. 2 is a plan view of the semiconductor device 101 as viewed in the direction opposite to the direction Z in the range illustrated in FIG. 1.

Figure 3:
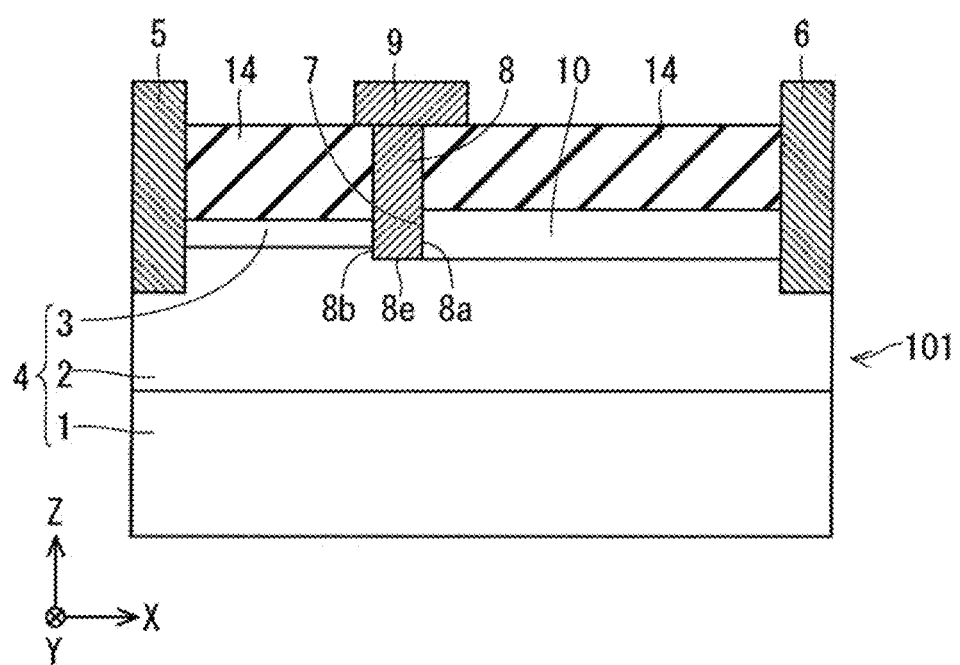
FIG. 3 is a cross-sectional view illustrating a cross section of the semiconductor device according to the first embodiment at the position AA of FIG. 2.
Figure 4:
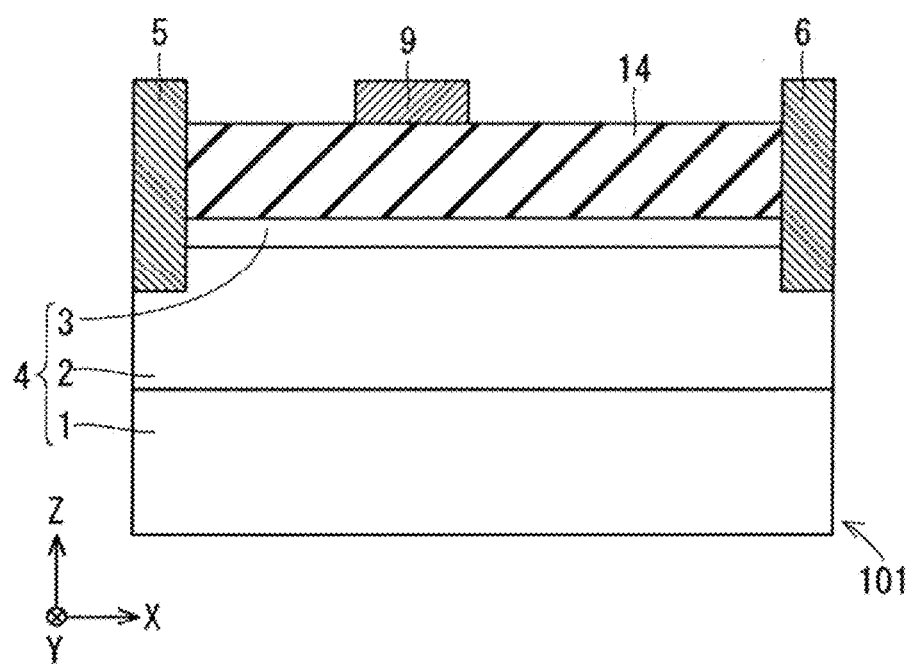
FIG. 4 is a cross-sectional view illustrating a cross section of the semiconductor device according to the first embodiment at the position BB of FIG. 2.

FIG. 3 is a cross-sectional view illustrating a cross section of the semiconductor device 101 at the position AA of FIG. 2. FIG. 4 is a cross-sectional view illustrating a cross section of the semiconductor device 101 at the position BB of FIG. 2. FIG. 5 is a cross-sectional view illustrating a cross section of the semiconductor device 101 at the position CC of FIG. 2.

The semiconductor device 101 includes a semiconductor layer group 4, a source electrode 5, a drain electrode 6, gate electrodes 8, a conductor 9, and first layers 10. The semiconductor layer group 4 includes nitride semiconductor layers 2 and 3 laminated along the direction Z. The nitride semiconductor layers 2 and 3 are, for example, epitaxial layers epitaxially grown on a substrate 1. In the present disclosure, the description is made that the substrate 1 is included in the semiconductor layer group 4.

The semiconductor device 101 further includes a protective film 14. For ease of understanding, the protective film 14 is omitted in FIGS. 1 and 2. In FIG. 2, the conductor 9 is drawn by a two-dot chain line.

The number of gate electrodes 8 is plural, and they are arranged in the direction Y. Each of the gate electrodes 8 is in contact with the nitride semiconductor layer 3 in the direction Y. For example, a gate electrode 8 has surfaces 8c and 8d. The surface 8c appears on the direction Y side of the gate electrode 8 having the surface 8c. The surface 8d appears on the opposite side of the direction Y of the gate electrode 8 having the surface 8d. The gate electrode 8 has a surface 8e and the surface 8e appears on the opposite side of the direction Z of the gate electrode 8 having the surface 8e. It can also be said that in the semiconductor layer group 4, a groove 7 is open in which a part of the gate electrode 8 is buried.

In the present disclosure, each of the gate electrodes 8 extends through the nitride semiconductor layer 3 in the direction opposite to the direction Z and reaches the nitride semiconductor layer 2. In this case, the surfaces 8c and 8d also contact the nitride semiconductor layer 2 in the direction Y.

The conductor 9 is located away from the semiconductor layer group 4. The conductor 9 electrically connects the gate electrodes 8 to each other. In the present disclosure, the conductor 9 has a shape extending along the direction Y above the semiconductor layer group 4.

The source electrode 5 is opposite to the gate electrodes 8 in direction X. The drain electrode 6 is apart from and opposite to the source electrode 5 via the gate electrodes 8 in the direction X. The source electrode 5, the gate electrodes 8, and the drain electrode 6 are arranged in this order in the direction X. The gate electrodes 8 have a surface 8b on the source electrode 5 side. The gate electrodes 8 have a surface 8a on the source electrode 6 side.

The source electrode 5 and the drain electrode 6 conduct with the nitride semiconductor layer 2. In the semiconductor device 101, the case is illustrated where the source electrode 5 and the drain electrode 6 extend through the nitride semiconductor layer 3 from above the nitride semiconductor layer 3 and reach the nitride semiconductor layer 2.

The number of the first layers 10 is plural, and the first layers 10 exist corresponding to the gate electrodes 8. The first layers 10 are located between the gate electrodes 8 and the drain electrode 6 in the direction X and are in contact with the gate electrodes 8. In the semiconductor device 101, the first layers 10 are in contact with the surfaces 8a and the drain electrode 6. The first layers 10 are in contact with the nitride semiconductor layer 3 in the direction Y.

In the semiconductor device 101, the case is illustrated where the first layers 10 extend through the nitride semiconductor layer 3 from above the nitride semiconductor layer 3 and reach the nitride semiconductor layer 2. Although in the drawing, the shape of the first layer 10 protruding in the direction Z side from the nitride semiconductor layer 3 is illustrated, such protrusion is not essential.

The first layer 10 has a function of relaxing the concentration of the electric field as described later. The first layer 10 is, for example, an insulator.

The nitride semiconductor layer 2 and the nitride semiconductor layer 3 form a heterojunction. The nitride semiconductor layers 2 and 3 form a Schottky junction with the gate electrode 8.

The formation of the heterojunction induces a two-dimensional carrier gas on the nitride semiconductor layer 2 side of the hetero interface located between the nitride semiconductor layer 2 and the nitride semiconductor layer 3. In the semiconductor device 101, the two-dimensional carrier gas is used for the current flowing between the source electrode 5 and the drain electrode 6 (so-called "drain current"). The current is controlled by the relationship of the voltages applied between the source electrode 5, the drain electrode 6, and the gate electrodes 8. Such control per se is known and will not be described in detail in the present disclosure.

In the following, the case will be described where the two-dimensional carrier gas is a two-dimensional electron gas as an example unless otherwise specified. For example, the nitride semiconductor layer 2 and the nitride semiconductor layer 3 both have an n-type conductivity type.

A plurality of gate electrodes 8 connected to each other by the conductor 9 are arranged in the semiconductor device 101. Electrons moving from the source electrode 5 pass along the direction X between adjacent gate electrodes 8 lying along the direction Y and head toward the drain electrode 6.

Depleted layers derived from the Schottky junctions are formed in the nitride semiconductor layers 2 and 3 interposed between the gate electrodes 8 in the direction Y. The width of the depleted layer is controlled by the voltage applied between the gate electrode 8 and the source electrode 5. Controlling the width of the depleted layer contributes to controlling the drain current. When the semiconductor device 101 is adopted as a switching element, the width of the depleted layer is controlled to control the On/Off of the semiconductor device 101.

For example, when a voltage that is negative with respect to the source electrode 5 (hereinafter, also simply referred to as "negative voltage") is applied to the gate electrodes 8, the depletion layers spread from the surfaces 8b, 8c, 8d, and 8e of the gate electrodes 8 into the nitride semiconductor layers 2 and 3. The spreading of the depleted layers close the channels in the nitride semiconductor layers 2 and 3 interposed between the gate electrodes 8 in the direction Y, to turn off the semiconductor device 101.

Arranging the gate electrodes 8 separately in the direction Y contributes to reducing the gate-drain capacitance and the gate-source capacitance of the semiconductor device 101. The reduction enhances the linearity in operation of the semiconductor device 101.

In a region opposite to the first layer 10 in the direction Z, the induction of two-dimensional electron gas in the nitride semiconductor layer 2 is suppressed. Such suppression makes the distance supporting the voltage between the gate electrode 8 and the drain electrode 6 becomes substantially long. The longer the distance, the smaller the electric field between the gate electrode 8 and the drain electrode 6 becomes, and the more the concentration of the electric field on the drain electrode 6 side of the gate electrode 8 is relaxed.

The first layer 10 relaxes the concentration of the electric field on the drain electrode 6 side of the gate electrode 8. Such relaxation increases the breakdown voltage of the semiconductor device 101. Increasing the breakdown voltage contributes to increasing the power output by the semiconductor device 101. A region where the first layer 10 intervenes between the nitride semiconductor layer 2 and the gate electrode 8 is present and this also contributes to the reduction of the leakage current (so-called "gate leak current") in the gate electrode 8 of the semiconductor device 101.

When the induction of two-dimensional electron gas in the nitride semiconductor layer 2 is suppressed, the gate-drain capacity and the source-drain capacity are reduced. The reduction of these capacitances contributes to the improvement of drain efficiency and power load efficiency.

The first layers 10 are located between the gate electrodes 8 and the drain electrode 6 in the direction X. The first layers 10 are not required to be aligned with the gate electrodes 8 in the direction Y. The drain current flows through the nitride semiconductor layer 2 by the two-dimensional electron gas in the nitride semiconductor layer 2 in the region interposed between the gate electrodes 8 (for example, position BB) arranged in the direction Y. The first layer 10 relaxes the concentration of the electric field on the drain electrode 6 side of the gate electrode 8 even though the first layer 10 does not exist in the region. The degree of freedom for the position of first layer 10 allows it to easily avoid a decrease in drain current. Degradation of the drain current of the semiconductor device 101 caused by the first layer 10 being located between the gate electrode 8 and the drain electrode 6 in the direction X and being in contact with the gate electrode 8 is less likely to happen. When the first layer 10 is juxtaposed with the gate electrode 8 in the direction Y, On/Off switching of the transistor may be prevented.

The protective film 14 covers the semiconductor layer group 4. The protective film 14 contributes to making the semiconductor device 101 less susceptible to the impact from the outside of the semiconductor device 101. The protective film 14 exposes an upper portion of each of the source electrode 5, the drain electrode 6, and the gate electrodes 8. Above the protective film 14, the conductor 9 connects the plurality of gate electrodes 8 to each other. The protective film 14 may also cover the conductor 9. The substrate 1 and the protective film 14 are not essential for the operation of the semiconductor device 101.

In the narrow channel structure illustrated in Patent Document 1, Patent Document 2, and Patent Document 3, in addition to the gate structure adopting Schottky junction, the Metal-Insulator-Semiconductor (MIS) gate structure is also proposed.

In the MIS gate structure, an insulating film is located between the gate electrode and the semiconductor layer. Typically, in a transistor having a MIS gate structure, a gate leakage current thereof is reduced. Further, the MIS gate structure contributes to expanding the range of controlling the gate voltage in the forward direction in the transistor in which the structure is adopted. Such contribution improves the power output by the transistor.

When the MIS gate structure is adopted in the buried gate arrangement structure of Non-Patent Document 1, the depleted layer does not spread in the lateral direction of the gate electrode, and the transistor does not operate.

In the semiconductor device 101 according to the first embodiment, the gate electrodes 8 form a Schottky junction with the nitride semiconductor layers 2 and 3. The semiconductor device 101 has a structure different from the MIS structure having a narrow channel structure, the difference being the depleted layer spreading in the direction Y in which the gate electrodes 8 are arranged.

The drain electrode 6 side of the gate electrodes 8 being in contact with the first layers 10 is a structure different from that of the buried gate arrangement structure of Non-Patent Document 1. The first layers 10 contribute to the reduction in gate leak current.

[Modification of Structure]

An other nitride semiconductor layer may exist any of between the nitride semiconductor layer 2 and the nitride semiconductor layer 3, between the substrate 1 and the nitride semiconductor layer 2, and on the opposite side of the nitride semiconductor layer 2 on the nitride semiconductor layer 3 (on the direction Z side to the nitride semiconductor layer 3).

For example, a nitride semiconductor layer using aluminum nitride (AlN) as a base material is arranged as a spacer layer between the nitride semiconductor layer 2 and the nitride semiconductor layer 3. For example, the nitride semiconductor layer using AlN as a base material is arranged as a nucleation layer between the substrate 1 and the nitride semiconductor layer 2. For example, a nitride semiconductor layer using GaN as a base material is arranged as a cap layer on the nitride semiconductor layer 3.

Two-dimensional electron gas moves and drain current flows. The two-dimensional electron gas flows through the nitride semiconductor layer 2. The source electrode 5 and the drain electrode 6 need only be electrically connected to the nitride semiconductor layer 2 and do not need to extend through the nitride semiconductor layer 3. For example, the source electrode 5 may be located on the nitride semiconductor layer 3. In this case, for example, the nitride semiconductor layers 2 and 3 are doped with a concentration at which ohmic contact is established between the nitride semiconductor layers 2 and 3 and the source electrode 5. Similar arrangement and doping may be adopted for the drain electrode 6.

The first layer 10 does not need to extend through the nitride semiconductor layer 3. Suppressing the induction of two-dimensional electron gas in the nitride semiconductor layer 2 in the region opposite to the first layer 10 does not presuppose that the first layer 10 is in contact with the nitride semiconductor layer 2.

For example, there is a case where the first layer 10 is in contact with at least the nitride semiconductor layer 3 in the direction Y and is not necessarily in contact with the nitride semiconductor layer 2. When the induction of two-dimensional electron gas on the semiconductor layer group 4 side (opposite to the direction Z) with respect to the first layer 10 is suppressed, the function of relaxing the concentration of the electric field is obtained by the first layer 10. Even if the nitride semiconductor layer 3 is interposed between the first layer 10 and the nitride semiconductor layer 2 in the direction Z, the thinness of the nitride semiconductor layer 3 suppresses the induction of the two-dimensional electron gas in the nitride semiconductor layer 2 in some cases.

As illustrated in the semiconductor device 101, the contact of the first layer 10 with the nitride semiconductor layer 2 contributes to suppressing the induction of two-dimensional electron gas in the nitride semiconductor layer 2 in the region opposite to the first layer 10.

The existence of the first layer 10 downward from (on the opposite side to the direction Z) the position in the direction Z of the two-dimensional electron gas induced in the region where the first layer 10 is not formed, for example, the position BB, is advantageous in terms of suppressing the induction of two-dimensional electron gas.

The gate electrodes 8 do not need to extend through the nitride semiconductor layer 3. For example, the nitride semiconductor layer 3 may be interposed between the gate electrodes 8 and the nitride semiconductor layer 2. Even in this case, the depletion layer extends along the direction Y by applying a negative voltage to the gate electrodes 8.

As illustrated in the semiconductor device 101, the extension of the gate electrodes 8 below the two-dimensional electron gas contributes to facilitating mutual contact between adjacent depleted layers in the direction Y.

[Component Specifications]

Examples of the material of the substrate 1 include silicon carbide (SiC), Si, gallium nitride (GaN), AlN, and sapphire.

Examples of the materials of the nitride semiconductor layers 2 and 3 include $In_xAl_yGa_{(1-x-y)}N(0 \leq x \leq 1, 0 \leq y \leq 1, 0 \leq x+y \leq 1)$. The nitride semiconductor may be undoped, or may have a p-type conductivity type or an n-type conductivity type. For example, in order to have an n-type conductivity type, silicon is ion-implanted into a nitride semiconductor and this is subject to heat treatment to activate the silicon as a donor. The composition of the compound of the nitride semiconductor and the concentration of doping do not need to be constant with respect to the position, and may change continuously or stepwise.

The structure in which the nitride semiconductor layer 2 and the nitride semiconductor layer 3 are laminated is a structure in which two-dimensional electron gas is generated by heterojunction. For example, GaN is an example of the material of the nitride semiconductor layer 2, and $Al_{0.25}Ga_{0.75}N$ is an example of the material of the nitride semiconductor layer 3.

The thickness thick enough for electrons to flow suffices for the thickness of the nitride semiconductor layer 2. For example, the thickness of the nitride semiconductor layer 2 is 200 nm. The thickness thick enough for inducing the two-dimensional electron gas in the nitride semiconductor layer 2 suffices for the thickness of the nitride semiconductor layer 3. For example, the thickness of the nitride semiconductor layer 3 is 15 nm.

The distance along the direction X between the source electrode 5 and the drain electrode 6 is, for example, 2.0 μm.

Obtaining ohmic contact both between the source electrode 5 and the semiconductor layer group 4 and between the drain electrode 6 and the semiconductor layer group 4 contributes to the reduction in the on-resistance of the semiconductor device 101. For example, both the source electrode 5 and the drain electrode 6 are formed using a single layer or a lamination layer containing a metal exemplified by Ti, Al, and Au.

For example, both the gate electrodes 8 and the conductor 9 are formed using a single layer or a lamination layer containing a metal exemplified by Ni, Pt, and Au.

A gap between the gate electrodes 8 along the direction Y and the thickness of the gate electrodes 8 are set so that adjacent depleted layers in the direction Y come into contact with each other by applying a negative voltage to the gate electrodes 8.

For example, the gate electrode 8 is square in plan view, the width and length of the gate electrode 8 are both 150 nm, and the thickness of the portion in contact with the semiconductor layer group 4 is 60 nm. For example, the distance between the gate electrodes 8 along the direction Y is 250 nm. The gaps between the plurality of gate electrodes 8 arranged in direction Y do not need to be equal to each other.

The arrangement of the plurality of gate electrodes 8 at equal intervals simplifies the creation of a mask used for, for example, photolithography when forming grooves 7 in the semiconductor layer group 4. This simplicity improves the uniformity of the structure of the gate electrodes 8.

The width of the first layer 10 may be wider than the width of the gate electrode 8. The width of the first layer 10 being the same as the width of the gate electrode 8 or smaller than the width of the gate electrode 8 contributes to obtaining a large drain current.

In the thickness of the first layer 10 and the thickness of the gate electrode 8, one of which may be larger than the other or equal to each other in their portions in contact with the semiconductor layer group 4.

In the semiconductor device 101, the first layers 10 are in contact with not only the gate electrodes 8 but also with the drain electrode 6. The length of the first layer 10 is, for example, 1.5 μm. The width of the first layer 10 is, for example, 150 nm. The first layers 10 are arranged at a distance of, for example, 250 nm in the direction Y. The thickness of the first layer 10 is, for example, 60 nm in its portion in contact with the semiconductor layer group 4.

The adoption of an insulator as the material of the first layers 10 contributes to relaxing the concentration of the electric field described above. Examples of the material of the first layer 10 include $Al_2O_3$, silicon nitride (SiN), and $SiO_2$. Air may be adopted for the first layer 10.

Alternatively, the first layer 10 may be obtained by losing the conductivity of the surface of the semiconductor layer group 4 on the direction Z side. For example, by implanting Ar into the semiconductor layer group 4, the conductivity of the nitride semiconductor layer 3 or the nitride semiconductor layer 2 can be lost and they can be converted into an insulator.

Any material that suppresses the induction of two-dimensional electron gas in the nitride semiconductor layer 2 in the region opposite to the first layer 10 can be used as the first layer 10. From this point of view, the first layer 10 may be formed of a semiconductor having the same conductivity type as the nitride semiconductor layer 3. For example, a nitride semiconductor layer having a lower doping concentration than the nitride semiconductor layer 3 and having the same conductivity type can be adopted as the first layer 10.

The effect of suppressing two-dimensional electron gas from being induced due to the first layer 10 is higher in a case where any of an insulator, a semiconductor having a conductivity type opposite to that of the nitride semiconductor layer 3, and an intrinsic semiconductor is adopted for the first layer 10 than in a case where a semiconductor having the same conductivity type as the nitride semiconductor layer 3 is adopted for the first layer 10. The case where a semiconductor having a conductive type opposite to that of the nitride semiconductor layer 3 is adopted for the first layer 10 will also be described in the twelfth embodiment.

When a conductor is adopted for the first layer 10, the effect of relaxing the concentration of the electric field is small even if the two-dimensional electron gas is not induced in the nitride semiconductor layer 2. It is considered that when a conductor is adopted for the first layer 10, the first layer 10 conducts with the gate electrode 8 and substantially functions as the gate electrode 8. When a conductor is adopted for the first layer 10, the gate electrode 8 and the drain electrode 6 conduct to each other. Such conduction hinders the operation of the transistor.

It can be said that at least a part of the first layer 10 is buried in the semiconductor layer group 4 as with the gate electrode 8. For example, the first layers 10 may be formed by forming grooves in the semiconductor layer group 4 and performing deposition to fill the grooves. For example, the grooves and the grooves 7 are concurrently formed. Such concurrent formation contributes to the reduction in damage given to the semiconductor layer group 4. Either the formation of the first layers 10 or the formation of the gate electrodes 8 may be performed first.

For example, the gate electrodes 8 and the conductor 9 are obtained by sputtering. For example, the gate electrodes 8 and the conductor 9 are obtained by chemical vapor deposition (CVD).

The protective film 14 having insulating property contributes to avoiding a short circuit between the source electrode 5, the drain electrode 6, and the gate electrodes 8. Examples of the material of the protective film 14 include SiN, $Al_2O_3$, $SiO_2$, and resin. The protective film 14 does not need to be a single layer. The protective film 14 may be a laminated film including a first film that suppresses surface trapping in the nitride semiconductor layer 3 and a second film that is arranged on the first film to obtain moisture resistance.

Second Embodiment

Figure 6:
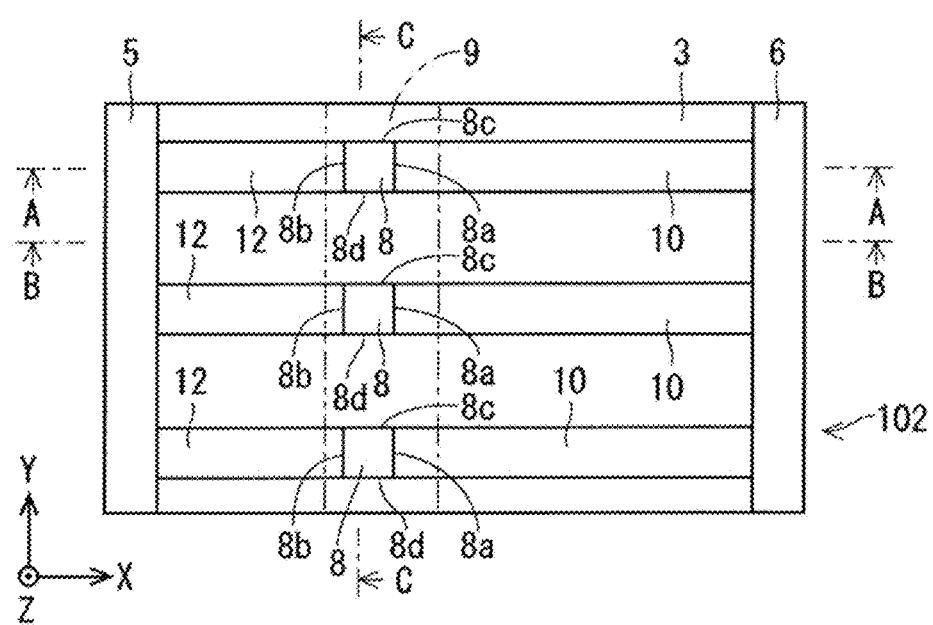
FIG. 6 is a plan view illustrating the structure of the semiconductor device according to a second embodiment.

FIG. 6 is a plan view illustrating a structure of a semiconductor device 102 according to a second embodiment. FIG. 6 illustrates the same range as that illustrated in FIG. 2 for the semiconductor device 101. In FIG. 6, the same positions AA, BB, and CC as those illustrated in FIG. 2 are also illustrated. In FIG. 6, the protective film 14 is omitted, and the conductor 9 is drawn by a two-dot chain line.

Figure 7:
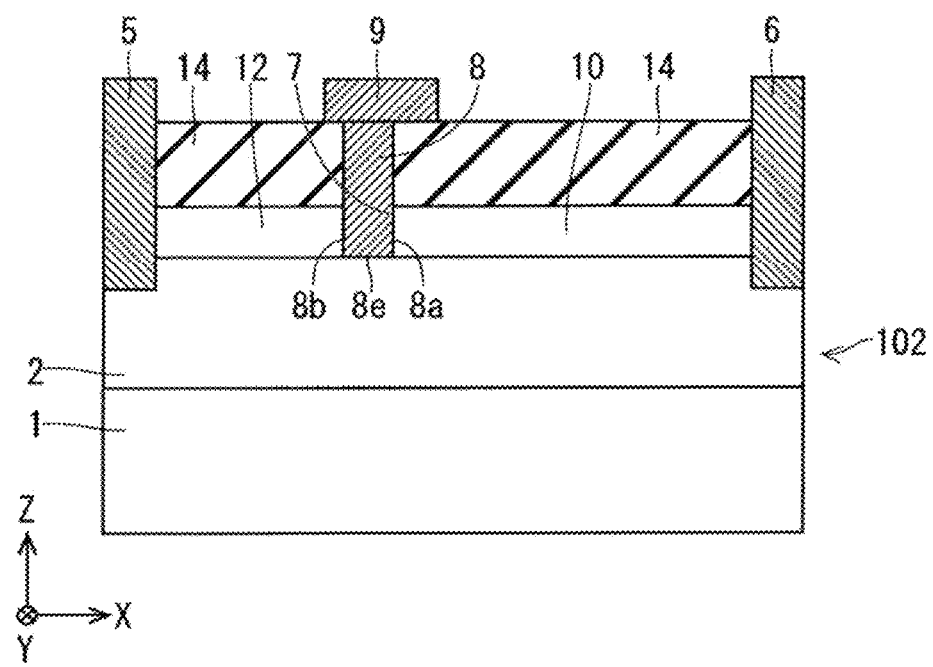
FIG. 7 is a cross-sectional view illustrating a cross section of the semiconductor device according to the second embodiment at the position AA of FIG. 6.

FIG. 7 is a cross-sectional view illustrating a cross section of the semiconductor device 102 at the position AA of FIG. 6. The cross section of the semiconductor device 102 at the position BB of FIG. 6 appears in the same manner as the cross section of the semiconductor device 101 illustrated in FIG. 4. The cross section of the semiconductor device 102 at the position CC of FIG. 6 appears in the same manner as the cross section of the semiconductor device 101 illustrated in FIG. 5.

The semiconductor device 102 has a structure in which second layers 12 are added to the semiconductor device 101.

The number of the second layers 12 is plural, and the second layers 12 exist corresponding to the gate electrodes 8. The second layers 12 are located between the gate electrodes 8 and the source electrode 5 in the direction X and are in contact with the gate electrodes 8. In the semiconductor device 102, the second layers 12 are in contact with the surfaces 8b and the source electrode 5. The second layers 12 are in contact with the nitride semiconductor layer 3 in the direction Y.

In the semiconductor device 102, the case is illustrated where the second layers 12 extend through the nitride semiconductor layer 3 from above the nitride semiconductor layer 3 and reach the nitride semiconductor layer 2. Although in the drawing, the shape of the second layer 12 protruding in the direction Z side from the nitride semiconductor layer 3 is illustrated, such protrusion is not essential.

The second layer 12 is formed of, for example, an insulator or a semiconductor, as with the first layers 10. As with the first layer 10, the semiconductor is preferably an intrinsic semiconductor or has a conductivity type opposite to that of the nitride semiconductor layer 3.

The positions of the second layers 12 in the direction Z may be selected in the same manner as the positions of the first layers 10 in the direction Z. For example, in the direction Z, the nitride semiconductor layer 3 may be interposed between the second layers 12 and the nitride semiconductor layer 2. The second layers 12 may extend through the nitride semiconductor layer 3 in the direction Z and are in contact with the nitride semiconductor layer 2. The second layer 12 may exist downward from the position in the direction Z of the two-dimensional electron gas induced in the region where the second layer 12 is not formed, for example, the position BB. The positions of the second layers 12 in the direction Z may be different from positions of the first layers 10 in the direction Z.

In a region opposite to the second layer 12 in the direction Z, the induction of two-dimensional electron gas in the nitride semiconductor layer 2 is suppressed. Such suppression reduces gate-source capacitance and source-drain capacitance. The reduction of these capacitances contributes to the improvement of drain efficiency and power load efficiency.

For example, when a charged human body is in contact with the semiconductor device 102, electrostatic discharge (ESD) occurs (for example, refer to JEDEC standards JESD22-A114 human body model (HBM) test in electrostatic breakdown). The static electricity causes an increase in the electric field at the source electrode 5. The second layer 12 relaxes the concentration of the electric field on the source electrode 5 side of the gate electrode 8. Such relaxation contributes to reducing the potential of electrostatic discharge of the semiconductor device 102.

As with the first layer 10, the second layer 12 relaxes the concentration of the electric field on the source electrode 5 side of the gate electrode 8 even though it does not exist in the region interposed between the gate electrodes 8 arranged in the direction Y (for example, the position BB). The degree of freedom for the position of second layer 12 allows it to easily avoid a decrease in drain current. Degradation of the drain current of the semiconductor device 102 caused by the second layer 12 being located between the gate electrode 8 and the source electrode 5 in the direction X and being in contact with the gate electrode 8 is less likely to happen.

As the material of the second layer 12, for example, the examples given as the material of the first layer 10 are adopted. The material of the first layer 10 and the material of the second layer 12 do not need to match. The matching of the material of the first layer 10 and the material of the second layer 12 contributes to the easy formation of the first layer 10 and the second layer 12.

Third Embodiment

Figure 8:
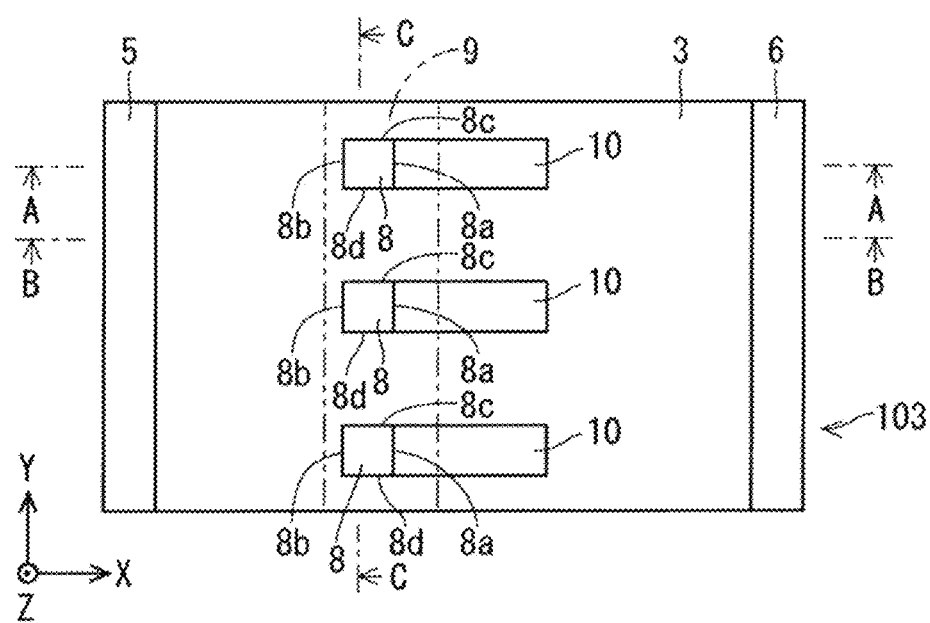
FIG. 8 is a plan view illustrating a structure of a semiconductor device according to a third embodiment.

FIG. 8 is a plan view illustrating a structure of a semiconductor device 103 according to a third embodiment. FIG. 8 illustrates the same range as that illustrated in FIG. 2 for the semiconductor device 101. In FIG. 8, the same positions AA, BB, and CC as those illustrated in FIG. 2 are also illustrated. In FIG. 8, the protective film 14 is omitted, and the conductor 9 is drawn by a two-dot chain line.

Figure 9:
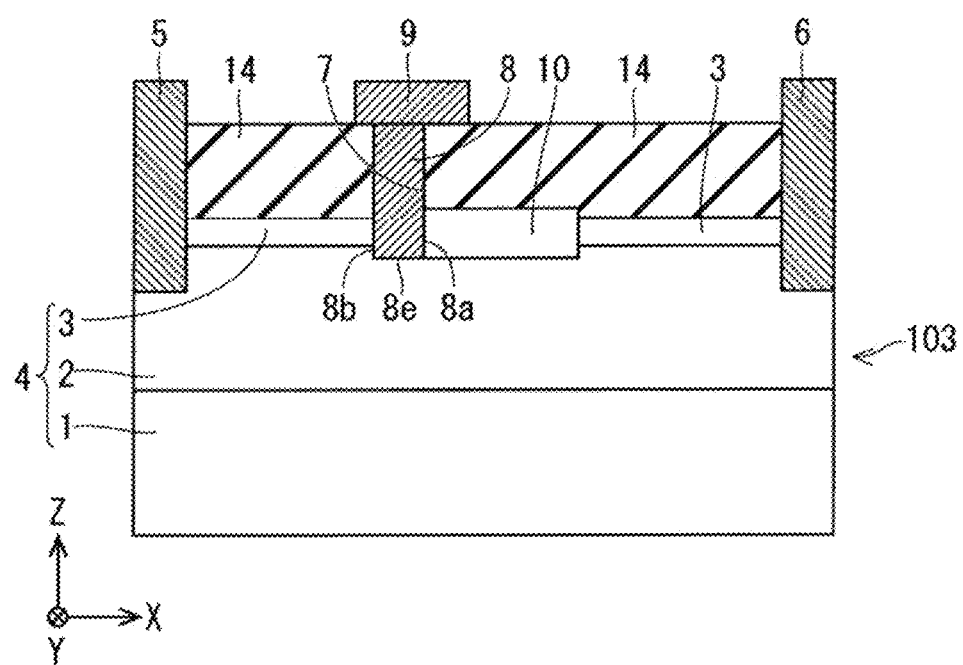
FIG. 9 is a cross-sectional view illustrating a cross section of the semiconductor device according to the third embodiment at the position AA of FIG. 8.

FIG. 9 is a cross-sectional view illustrating a cross section of the semiconductor device 103 at the position AA of FIG. 8. The cross section of the semiconductor device 103 at the position BB of FIG. 8 appears in the same manner as the cross section of the semiconductor device 101 illustrated in FIG. 4. The cross section of the semiconductor device 103 at the position CC of FIG. 8 appears in the same manner as the cross section of the semiconductor device 101 illustrated in FIG. 5.

The semiconductor device 103 differs from the semiconductor device 101 in that the length of the first layer 10 is shorter than the distance between the gate electrode 8 and the drain electrode 6. In the semiconductor device 103, the nitride semiconductor layers 2 and 3 are interposed between the first layer 10 and the drain electrode 6 along the direction X.

In the semiconductor device 101, electrons directed from between the gate electrodes 8 to the drain electrode 6 move between adjacent first layers 10 in the direction Y. In the semiconductor device 103, electrons directed from between the gate electrodes 8 to the drain electrode 6 move not only between the adjacent first layers 10 in the direction Y but also in the region interposed between the first layers 10 and the drain electrode 6. Compared with the semiconductor device 101, the semiconductor device 103 has a wider region of two-dimensional electron gas that contributes to the drain current, and a large drain current is obtained. The large drain current increases the power output by the transistor realized by the semiconductor device 101 and enhances efficiency.

Fourth Embodiment

Figure 10:
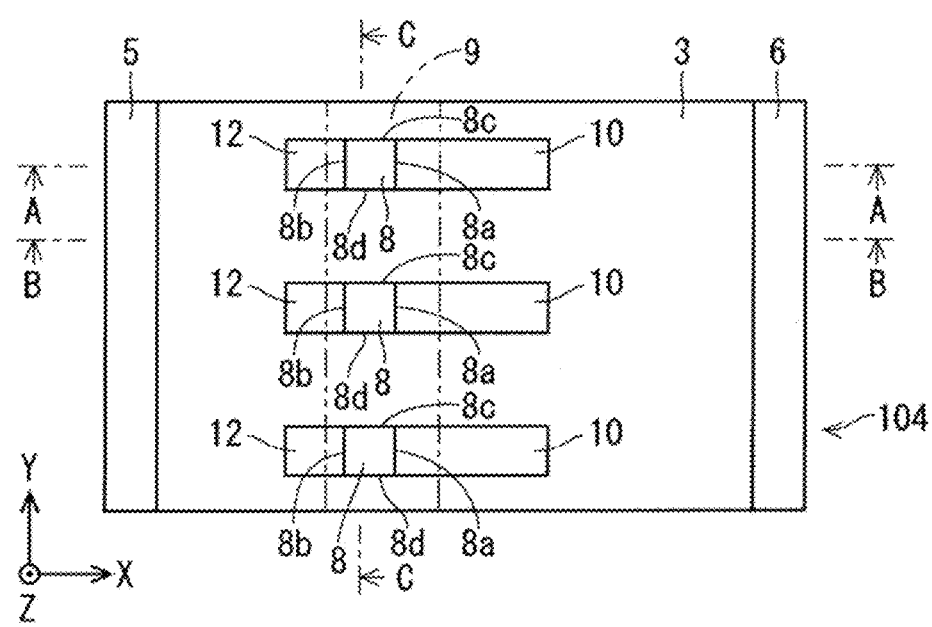
FIG. 10 is a plan view illustrating a structure of a semiconductor device according to a fourth embodiment.

FIG. 10 is a plan view illustrating a structure of a semiconductor device 104 according to a fourth embodiment. FIG. 10 illustrates the same range as that illustrated in FIG. 2 for the semiconductor device 101. In FIG. 10, the same positions AA, BB, and CC as those illustrated in FIG. 2 are also illustrated. In FIG. 10, the protective film 14 is omitted, and the conductor 9 is drawn by a two-dot chain line.

Figure 11:
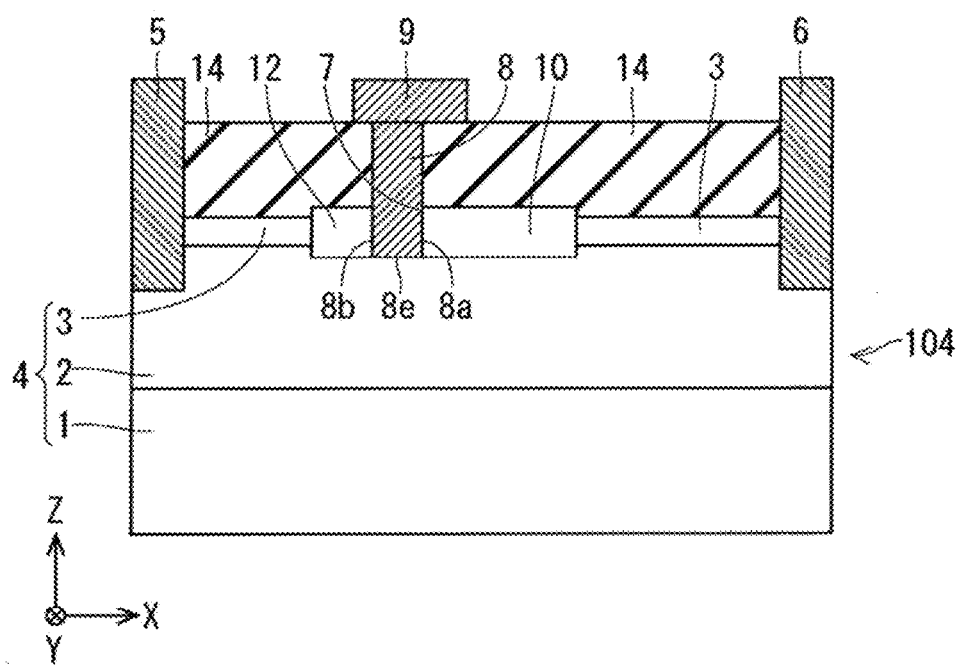
FIG. 11 is a cross-sectional view illustrating a cross section of the semiconductor device according to the fourth embodiment at the position AA of FIG. 10.

FIG. 11 is a cross-sectional view illustrating a cross section of the semiconductor device 104 at the position AA of FIG. 10. The cross section of the semiconductor device 104 at the position BB of FIG. 10 appears in the same manner as the cross section of the semiconductor device 101 illustrated in FIG. 4. The cross section of the semiconductor device 104 at the position CC of FIG. 10 appears in the same manner as the cross section of the semiconductor device 101 illustrated in FIG. 5.

The semiconductor device 104 differs from the semiconductor device 102 in that the length of the first layer 10 is shorter than the distance between the gate electrode 8 and the drain electrode 6 and the length of the second layer 12 is shorter than the distance between the gate electrode 8 and the source electrode 5.

The semiconductor device 104 has a structure in which second layers 12 are added to the semiconductor device 103. The second layers 12 are located between the gate electrodes 8 and the source electrode 5 in the direction X and are in contact with the gate electrodes 8. In the semiconductor device 104, the second layers 12 are in contact with the surfaces 8b. The length of the second layer 12 is shorter than the distance between the gate electrode 8 and the source electrode 5. Above said second layer 12 may be added to the semiconductor device 101.

In the semiconductor device 104, along the direction X, the nitride semiconductor layers 2 and 3 are interposed between the first layer 10 and the drain electrode 6 and the nitride semiconductor layers 2 and 3 are interposed between the second layer 12 and the source electrode 5.

In the semiconductor device 102, electrons directed from between the source electrode 5 to the gate electrode 8 move between adjacent second layers 12 in the direction Y. In the semiconductor device 104, electrons directed from the source electrode 5 to between the gate electrodes 8 move not only between the adjacent second layers 12 in the direction Y but also in the region interposed between the second layers 12 and the drain electrode 6.

Compared with the semiconductor device 102, the semiconductor device 104 has a wider region of two-dimensional electron gas that contributes to the drain current, and a large drain current is obtained.

Compared with the semiconductor device 103, the semiconductor device 104 relaxes the concentration of the electric field on the source electrode 5 side of the gate electrode 8.

Fifth Embodiment

Figure 12:
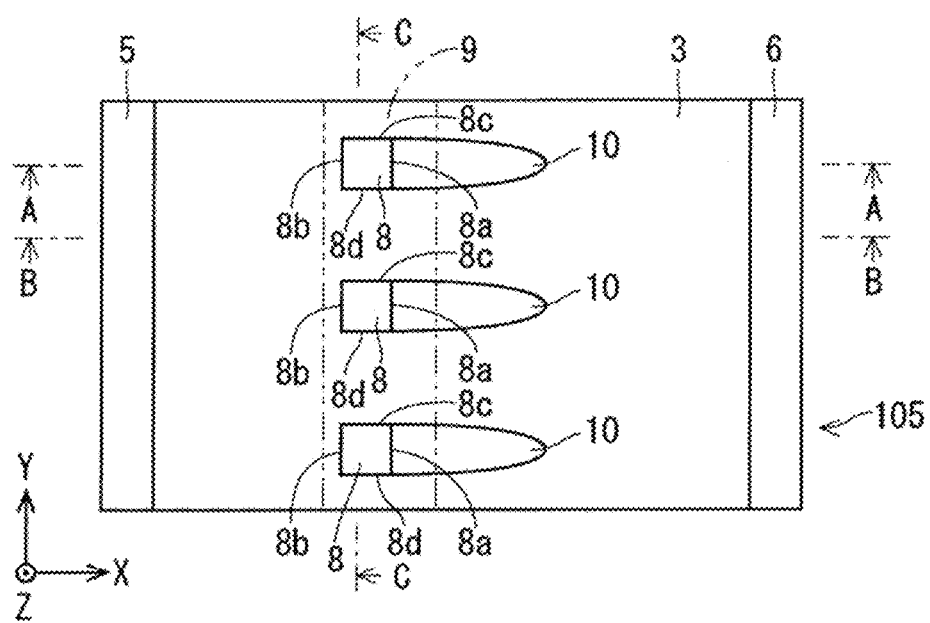
FIG. 12 is a plan view illustrating a structure of a semiconductor device according to a fifth embodiment.

FIG. 12 is a plan view illustrating a structure of a semiconductor device 105 according to a fifth embodiment. FIG. 12 illustrates the same range as that illustrated in FIG. 2 for the semiconductor device 101. In FIG. 12, the same positions AA, BB, and CC as those illustrated in FIG. 2 are also illustrated. In FIG. 12, the protective film 14 is omitted, and the conductor 9 is drawn by a two-dot chain line.

FIG. 13 is a cross-sectional view illustrating a cross section of the semiconductor device 105 at the position AA of FIG. 12. The cross section of the semiconductor device 105 at the position BB of FIG. 12 appears in the same manner as the cross section of the semiconductor device 101 illustrated in FIG. 4. The cross section of the semiconductor device 105 at the position CC of FIG. 12 appears in the same manner as the cross section of the semiconductor device 101 illustrated in FIG. 5.

Compared with the semiconductor device 103, the semiconductor device 105 has a feature that the width of the first layer 10 on the drain electrode 6 side is narrower than the width thereof on the gate electrode 8 side. The length of the first layer 10 along the direction Y decreases as it is away from the gate electrode 8 along the direction X. For example, the width of the first layer 10 coincides with the width of the surface 8a at the position where it is in contact with the surface 8a, and is narrower as it is closer to the drain electrode 6.

As with the semiconductor device 103, also in the semiconductor device 105, electrons directed from the source electrode 5 to between the gate electrodes 8 move not only between the adjacent second layers 12 in the direction Y but also in the region interposed between the second layers 12 and the drain electrode 6. When the electrons move from between the gate electrodes 8 toward the direction X, they spread and move toward both the direction Y and the opposite side of the direction Y. The first layers 10 in the semiconductor device 105 are less likely to hinder the spread of the electrons than the first layers 10 in the semiconductor device 104.

Compared with the semiconductor device 103, the semiconductor device 105 is less likely to hinder the move of the two-dimensional electron gas that contributes to the drain current, and a large drain current is obtained.

As the shape of the first layer 10, a shape whose width is narrowed stepwise toward the direction X may be adopted. Adopting a shape having a narrower width in a linear or curved toward the direction X as a shape of the first layer 10 is advantageous from the viewpoint of widening the place where the electric field is concentrated and relaxation of the concentration.

A structure in which the width of the drain electrode 6 side of the first layer 10 is narrower than the width thereof on the gate electrode 8 side can be adoptable to any structure of the semiconductor devices 101 to 104 and contributes to obtaining a large drain current.

Sixth Embodiment

Figure 14:
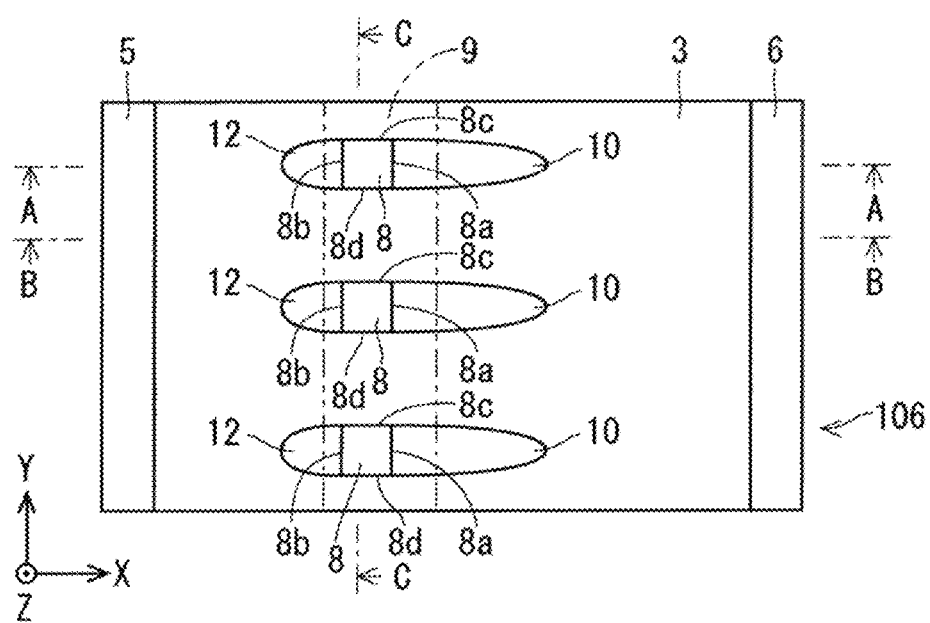
FIG. 14 is a plan view illustrating a structure of a semiconductor device according to a sixth embodiment.

FIG. 14 is a plan view illustrating a structure of a semiconductor device 106 according to a sixth embodiment. FIG. 14 illustrates the same range as that illustrated in FIG. 2 for the semiconductor device 101. In FIG. 14, the same positions AA, BB, and CC as those illustrated in FIG. 2 are also illustrated. In FIG. 14, the protective film 14 is omitted, and the conductor 9 is drawn by a two-dot chain line.

FIG. 15 is a cross-sectional view illustrating a cross section of the semiconductor device 106 at the position AA of FIG. 14. The cross section of the semiconductor device 106 at the position BB of FIG. 14 appears in the same manner as the cross section of the semiconductor device 101 illustrated in FIG. 4. The cross section of the semiconductor device 106 at the position CC of FIG. 14 appears in the same manner as the cross section of the semiconductor device 101 illustrated in FIG. 5.

The semiconductor device 106 has a structure in which second layers 12 are added to the semiconductor device 105. The second layers 12 are located between the gate electrodes 8 and the source electrode 5 in the direction X and are in contact with the gate electrode 8. In the semiconductor device 106, the second layers 12 are in contact with the surfaces 8b. The length of the second layer 12 is shorter than the distance between the gate electrode 8 and the source electrode 5. The width of the second layer 12 on the source electrode 5 side is narrower than the width thereof on the gate electrode 8 side.

Compared with the semiconductor device 104, the semiconductor device 106 has a feature that the width of the first layer 10 on the drain electrode 6 side is narrower than the width thereof on the gate electrode 8 side and the width of the second layer 12 on the source electrode 5 side is narrower than the width thereof on the gate electrode 8 side.

The length of the first layer 10 along the direction Y decreases as it is away from the gate electrode 8 along the direction X. For example, the width of the first layer 10 coincides with the width of the surface 8a at the position where it is in contact with the surface 8a, and is narrower as it is closer to the drain electrode 6.

The length of the second layer 12 along the direction Y increases as it nears the gate electrode 8 along the direction X. For example, the width of the second layer 12 coincides with the width of the surface 8b at the position where it is in contact with the surface 8b, and is narrower as it is closer to the source electrode 5.

Compared with the semiconductor device 105, the semiconductor device 106 relaxes the concentration of the electric field on the source electrode 5 side of the gate electrode 8.

As with the semiconductor device 104, also in the semiconductor device 106, electrons directed from the source electrode 5 to between the gate electrodes 8 move not only between the adjacent second layers 12 in the direction Y but also in the region interposed between the second layers 12 and the drain electrode 6. When the electrons move from the drain electrode 6 to between the gate electrodes 8 toward the direction X, they narrow and move toward both direction Y and the opposite side of direction Y. The second layers 12 in the semiconductor device 106 are less likely to hinder the narrowing of the electrons than the second layers 12 in the semiconductor device 104.

Compared with the semiconductor device 104, the semiconductor device 106 is less likely to hinder the move of the two-dimensional carrier gas that contributes to the drain current, and a large drain current is obtained.

As the shape of the second layer 12, a shape whose width is widened stepwise toward the direction X may be adopted. Adopting a shape having a wider width in a linear or curved toward the direction X as a shape of the second layer 12 is advantageous from the viewpoint of widening the place where the electric field is concentrated and relaxation of the concentration.

The structure in which the length of the second layer 12 along the direction Y increases as it nears the gate electrode 8 along the direction X is applicable to any of the semiconductor devices 101 to 105.

Seventh Embodiment

Figure 16:
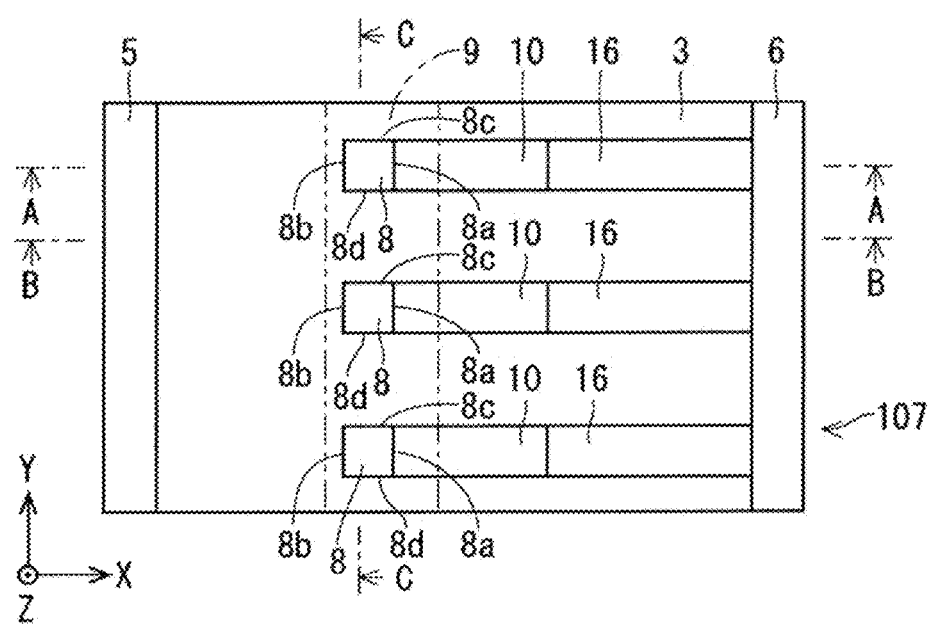
FIG. 16 is a plan view illustrating a structure of a semiconductor device according to a seventh embodiment.

FIG. 16 is a plan view illustrating a structure of a semiconductor device 107 according to a seventh embodiment. FIG. 16 illustrates the same range as that illustrated in FIG. 2 for the semiconductor device 101. In FIG. 16, the same positions AA, BB, and CC as those illustrated in FIG. 2 are also illustrated. In FIG. 16, the protective film 14 is omitted, and the conductor 9 is drawn by a two-dot chain line.

Figure 17:
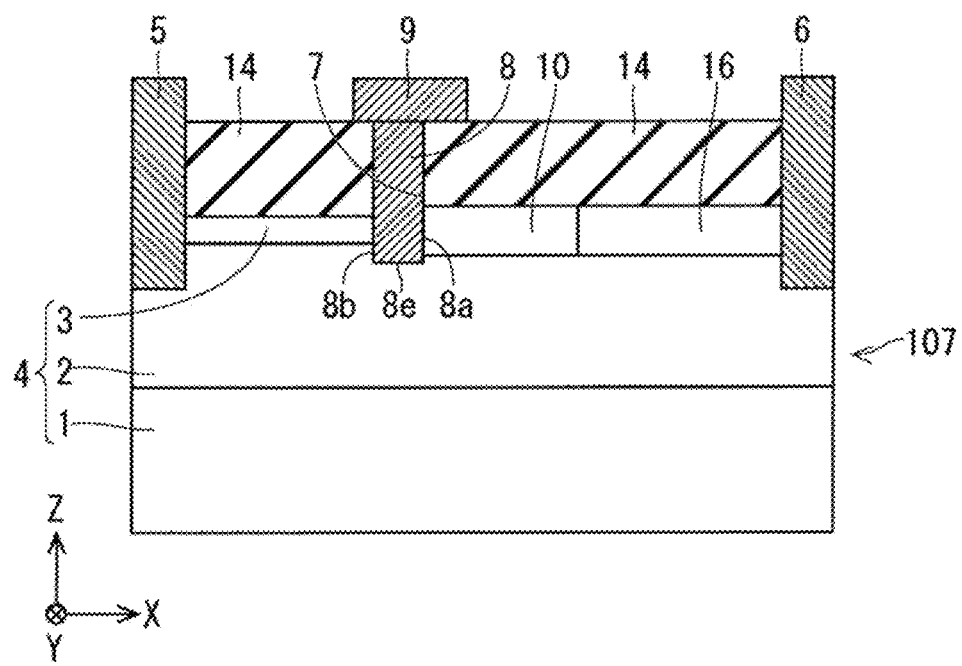
FIG. 17 is a cross-sectional view illustrating a cross section of the semiconductor device according to the seventh embodiment at the position AA of FIG. 16.

FIG. 17 is a cross-sectional view illustrating a cross section of the semiconductor device 107 at the position AA of FIG. 16. The cross section of the semiconductor device 107 at the position BB of FIG. 16 appears in the same manner as the cross section of the semiconductor device 101 illustrated in FIG. 4. The cross section of the semiconductor device 107 at the position CC of FIG. 16 appears in the same manner as the cross section of the semiconductor device 101 illustrated in FIG. 5.

The semiconductor device 107 has a structure in which fourth layers 16 are added to the semiconductor device 103.

The number of the fourth layers 16 is plural, and the fourth layers 16 exist corresponding to the gate electrodes 8. The fourth layers 16 are located between the first layers 10 and the drain electrode 6 in the direction X and are in contact with both the first layers 10 and the drain electrode 6. The fourth layers 16 are in contact with the nitride semiconductor layer 3 in the direction Y.

In the semiconductor device 107, the case is illustrated where the fourth layers 16 extend through the nitride semiconductor layer 3 from above the nitride semiconductor layer 3 and reach the nitride semiconductor layer 2. Although in the drawing, the shape of the fourth layer 16 protruding in the direction Z side from the nitride semiconductor layer 3 is illustrated, such protrusion is not essential.

The fourth layer 16 is formed of, for example, an insulator or a semiconductor, as with the first layer 10. As with the first layers 10, the semiconductor is preferably an intrinsic semiconductor or has a conductivity type opposite to that of the nitride semiconductor layer 3. The fourth layer 16 has a function of relaxing the concentration of the electric field similar to the first layer 10.

The positions of the fourth layers 16 in the direction Z may be selected in the same manner as the positions of the first layers 10 in the direction Z. For example, in the direction Z, the nitride semiconductor layer 3 may be interposed between the fourth layers 16 and the nitride semiconductor layer 2. The fourth layers 16 may extend through the nitride semiconductor layer 3 in the direction Z and are in contact with the nitride semiconductor layer 2. The fourth layer 16 may exist downward from the position in the direction Z of the two-dimensional electron gas induced in the region where the fourth layer 16 is not formed, for example, the position BB. The positions of the fourth layers 14 in the direction Z may be different from positions of the first layers 10 in the direction Z.

The permittivity of the fourth layer 16 is smaller than the permittivity of the first layer 10. A high permittivity facilitates the relaxation of the concentration of the electric fields. The relaxation of the concentration of the electric field contributes to increasing the power output by the semiconductor device 107. Low permittivity makes it easy to reduce gate-drain capacitance and source-drain capacitance. The reduction of these capacitances contributes to the improvement of drain efficiency and power load efficiency.

The electric field is prone to concentrate as it is closer to the gate electrode 8; therefore, the higher permittivity of the first layer 10 closer to the gate electrode 8 than the fourth layer 16 is advantageous in terms of reduction in the gate-drain capacitance and the source-drain capacitance and relaxation of the concentration of the electric field.

Assuming that the fourth layer 16 is regarded as a part of the first layer 10, it can be said that the semiconductor device 107 has a structure where the permittivity of the first layer 10 gradually decreases toward the direction X according to the semiconductor device 101. According to the first layer 10 in the semiconductor device 101, the permittivity of three or more types may gradually decrease in the first layer 10. The permittivity of the first layer 10 may decrease continuously toward the direction X.

Similar to the semiconductor device 103, the fourth layers 16 do not are in contact with the drain electrode 6, and the nitride semiconductor layer 3 may be interposed between the fourth layers 16 and the drain electrode 6.

The structure in which the permittivity of the first layer 10 decreases toward the direction X is applicable to any of the semiconductor devices 101 to 107, and contributes to the reduction of the gate-drain capacitance and the source-drain capacitance and the relaxation of the concentration of the electric field.

In the semiconductor devices 102, 104, and 106, the permittivity of the second layer 12 may decrease toward the direction opposite to the direction X. Such a feature contributes to the reduction in the gate-source capacitance and source-drain capacitance.

Eighth Embodiment

Figure 18:
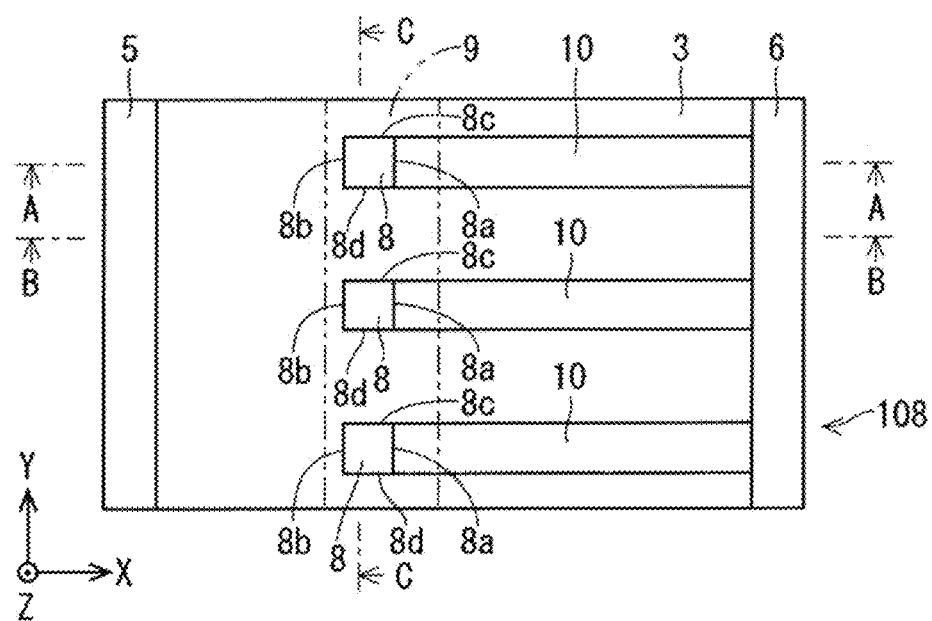
FIG. 18 is a plan view illustrating a structure of a semiconductor device according to an eighth embodiment.

FIG. 18 is a plan view illustrating a structure of a semiconductor device 108 according to an eighth embodiment. FIG. 18 illustrates the same range as that illustrated in FIG. 2 for the semiconductor device 101. In FIG. 18, the same positions AA, BB, and CC as those illustrated in FIG. 2 are also illustrated. In FIG. 18, the protective film 14 is omitted, and the conductor 9 is drawn by a two-dot chain line.

Figure 19:
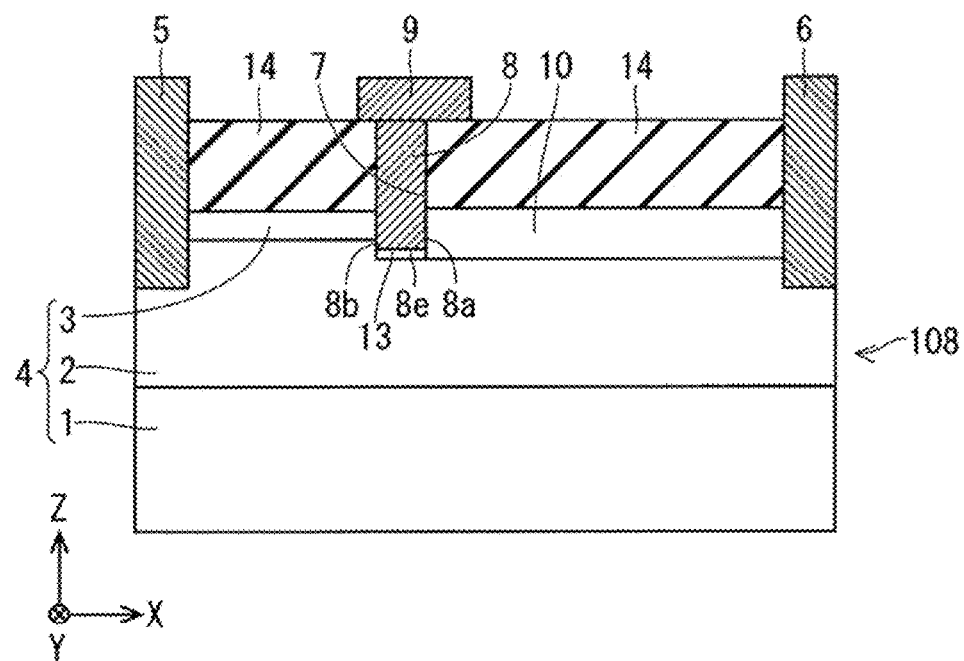
FIG. 19 is a cross-sectional view illustrating a cross section of the semiconductor device according to the eighth embodiment at the position AA of FIG. 18.

FIG. 19 is a cross-sectional view illustrating a cross section of the semiconductor device 108 at the position AA of FIG. 18. The cross section of the semiconductor device 108 at the position BB of FIG. 18 appears in the same manner as the cross section of the semiconductor device 101 illustrated in FIG. 4. FIG. 20 is a cross-sectional view illustrating a cross section of the semiconductor device 108 at the position CC of FIG. 18.

The semiconductor device 108 has a structure in which third layers 13 are added to the semiconductor device 103. The third layers 13 are in contact with the surfaces 8e.

As the material of the third layer 13, for example, the examples given as the material of the first layer 10 are adopted. The material of the first layer 10 and the material of the third layer 13 do not need to match. The matching of the material of the first layer 10 and the material of the third layer 13 contributes to the easy formation of the first layer 10 and the third layer 13.

The third layers 12 are located between the gate electrodes 8 and the semiconductor layer group 4 in the direction Z and are in contact with the gate electrodes 8. In FIGS. 19 and 20, the third layer 13 is located between the surface 8e and the nitride semiconductor layer 2 in direction Z. The third layer 13 relaxes the concentration of the electric field on the surface 8e side of the gate electrode 8. The third layer 13 being located between the gate electrode 8 and the nitride semiconductor layer 2 contributes to the reduction of the gate leak current.

The suppression described above is not directly related to the contact of the third layer 13 with the first layer 10. The third layers 13 contacting the first layers 10 makes it easier to concurrently form the third layers 13 and the first layers 10, for example, between the formation of the grooves 7 and the formation of the gate electrodes 8, for example, between the formation of the grooves 7 and the formation of the gate electrodes 8.

The third layer 13 is addable to any of the semiconductor devices 101 to 107, and this contributes to the reduction of the gate leak current.

Ninth Embodiment

Figure 21:
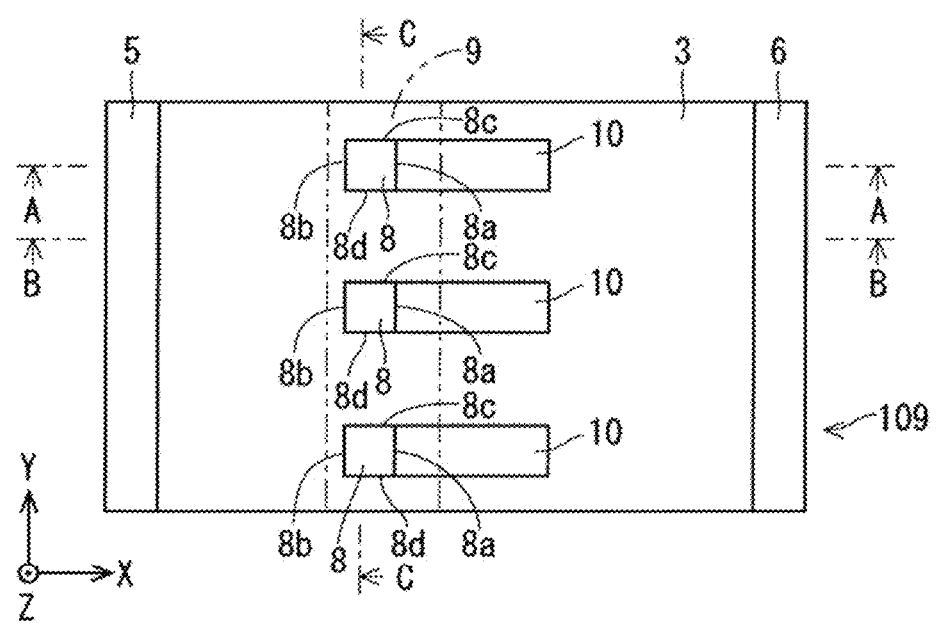
FIG. 21 is a plan view illustrating a structure of a semiconductor device according to a ninth embodiment.

FIG. 21 is a plan view illustrating a structure of a semiconductor device 109 according to a ninth embodiment. FIG. 21 illustrates the same range as that illustrated in FIG. 2 for the semiconductor device 101. In FIG. 21, the same positions AA, BB, and CC as those illustrated in FIG. 2 are also illustrated. In FIG. 21, the protective film 14 is omitted, and the conductor 9 is drawn by a two-dot chain line.

Figure 22:
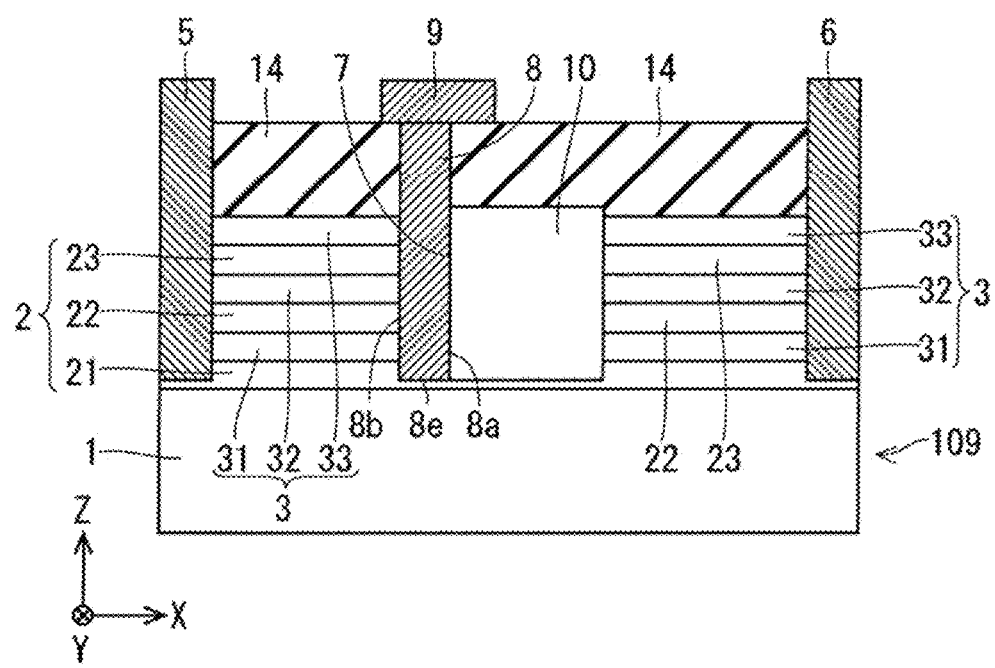
FIG. 22 is a cross-sectional view illustrating a cross section of the semiconductor device according to the ninth embodiment at the position AA of FIG. 21.
Figure 23:
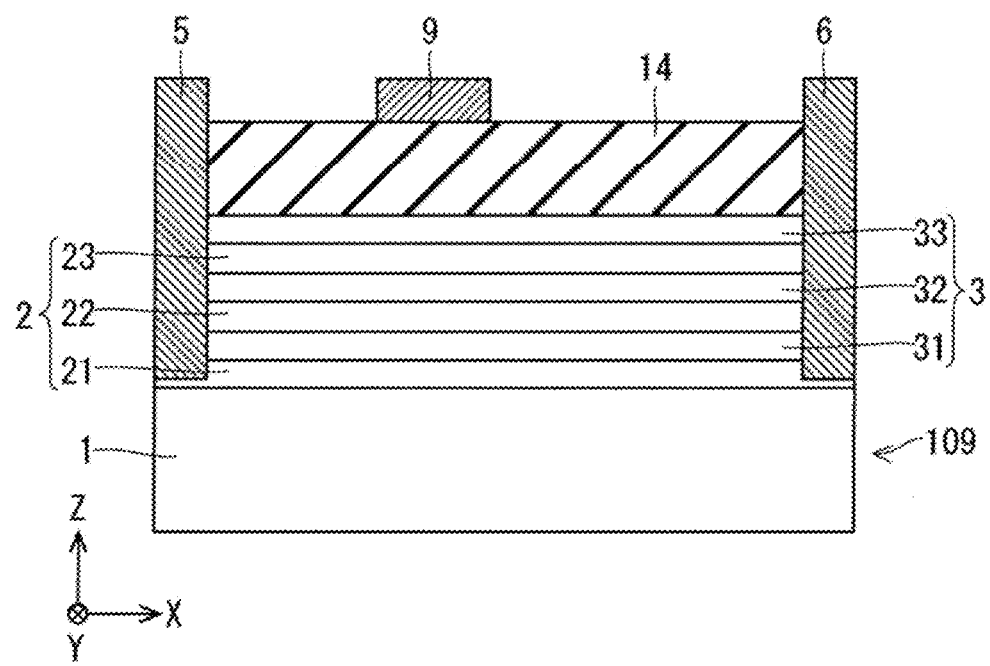
FIG. 23 is a cross-sectional view illustrating a cross section of the semiconductor device according to the ninth embodiment at the position BB of FIG. 21.
Figure 24:
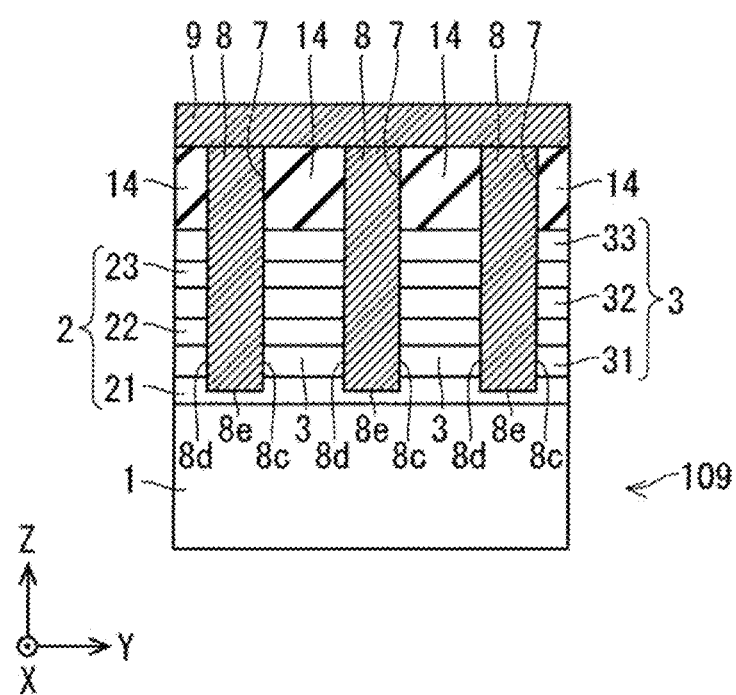
FIG. 24 is a cross-sectional view illustrating a cross section of the semiconductor device according to the ninth embodiment at the position CC of FIG. 21.

FIG. 22 is a cross-sectional view illustrating a cross section of the semiconductor device 109 at the position AA of FIG. 21. FIG. 23 is a cross-sectional view illustrating a cross section of the semiconductor device 109 at the position BB of FIG. 21. FIG. 24 is a cross-sectional view illustrating a cross section of the semiconductor device 109 at the position CC of FIG. 21.

The semiconductor device 109 differs from the semiconductor device 103 in the configuration of the nitride semiconductor layers 2 and 3. Specifically, the nitride semiconductor layer 2 includes nitride semiconductor layers 21, 22, and 23, and the nitride semiconductor layer 3 includes nitride semiconductor layers 31, 32, and 33.

The nitride semiconductor layer 21 and the nitride semiconductor layer 31 form a heterojunction. The nitride semiconductor layer 31 and the nitride semiconductor layer 22 form a heterojunction. The nitride semiconductor layer 22 and the nitride semiconductor layer 32 form a heterojunction. The nitride semiconductor layer 32 and the nitride semiconductor layer 23 form a heterojunction. The nitride semiconductor layer 23 and the nitride semiconductor layer 33 form a heterojunction.

Assuming the nitride semiconductor layer 21 is regarded as the nitride semiconductor layer 2 in the semiconductor device 103, it can be said that the semiconductor device 109 has a structure in which the nitride semiconductor layers 31, 22, 32, 23, and 33 are added, as the nitride semiconductor layer 3, on the semiconductor layer group 4 in the semiconductor device 103 in this order toward the direction Z.

Assuming the nitride semiconductor layers 21 and 31 are regarded as the nitride semiconductor layers 2 and 3, respectively, in the semiconductor device 103, it can be said that the semiconductor device 109 has a structure in which the nitride semiconductor layers 22, 32, 23, and 33 are added on the semiconductor layer group 4 in the semiconductor device 103 in this order toward the direction Z.

Assuming the nitride semiconductor layers 21, 31, and 22 are regarded as the nitride semiconductor layer 2 in the semiconductor device 103, it can be said that the semiconductor device 109 has a structure in which the nitride semiconductor layers 32, 23, and 33 are added, as the nitride semiconductor layer 3, on the semiconductor layer group 4 in the semiconductor device 103 in this order toward the direction Z.

Assuming the nitride semiconductor layers 21, 31, 22, 32, and 23 are regarded as the nitride semiconductor layer 2 in the semiconductor device 103, it can be said that the semiconductor device 109 has a structure in which the nitride semiconductor layer 33 is added, as the nitride semiconductor layer 3, on the semiconductor layer group 4 in the semiconductor device 103 on the direction Z side.

It can be said that the nitride semiconductor layer 2 includes a plurality of nitride semiconductor layers (tentatively referred to as "first sublayers" in the present disclosure), the nitride semiconductor layer 3 has a plurality of nitride semiconductor layers (tentatively referred to as "second sublayers" in the present disclosure), and the first sublayers and the second sublayers are alternately laminated.

It can also be said that the semiconductor layer group 4 has a plurality of nitride semiconductor layers 21, 22, and 23 and a plurality of nitride semiconductor layers 31, 32, and 33, and they are alternately laminated.

Two-dimensional carrier gas is induced in the heterojunction. In the semiconductor device 109, regions where the two-dimensional carrier gas is induced exist at a plurality of positions along the direction Z. The existence of a plurality of regions where the two-dimensional carrier gas is induced contributes to increasing the amount of the two-dimensional carrier gas that contributes to the drain current in the semiconductor device 109. The semiconductor device 109 obtains a larger drain current than the semiconductor device 103.

The laminated structure including the nitride semiconductor layers 21, 31, 22, 32, 23, and 33 may be obtained by a periodic superlattice structure. The number of such layers may be further increased, or the nitride semiconductor layers 23 and 33 may be omitted.

The composition, doping concentration, and film thickness of the nitride semiconductor layers 21, 22, and 23 may be the same as each other, or may be different from each other. The composition, doping concentration, and film thickness of the nitride semiconductor layers 31, 32, and 33 may be the same as each other, or may be different from each other.

Such a laminated structure in the nitride semiconductor layers 2 and 3 is applicable to any of the semiconductor devices 101 to 108, and contributes to obtaining a large drain current.

Tenth Embodiment

Figure 25:
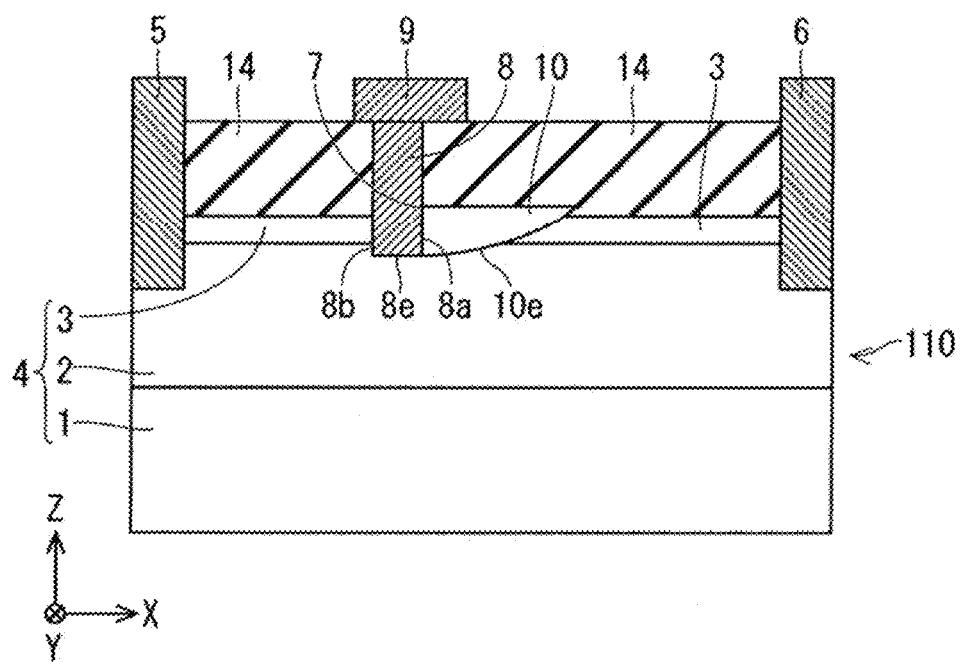
FIG. 25 is a cross-sectional view illustrating a structure of a semiconductor device according to a tenth embodiment.

FIG. 25 is a cross-sectional view illustrating a structure of a semiconductor device 110 according to a tenth embodiment. The plan view of the semiconductor device 110 appears in the same manner as, for example, the plan view of the semiconductor device 103 according to the third embodiment (see FIG. 8). In this case, FIG. 25 illustrates a cross section of the semiconductor device 110 at a position corresponding to the position AA illustrated in FIG. 8. The cross section of the semiconductor device 110 at a position corresponding to the position BB illustrated in FIG. 8 appears in the same manner as the cross section of the semiconductor device 101 illustrated in FIG. 4. The cross section of the semiconductor device 110 at a position corresponding to the position CC illustrated in FIG. 8 appears in the same manner as the cross section of the semiconductor device 101 illustrated in FIG. 5.

Or, the plan view of the semiconductor device 110 appears in the same manner as, for example, the plan view of the semiconductor device 105 according to the fifth embodiment (see FIG. 12). In this case, FIG. 25 illustrates a cross section of the semiconductor device 110 at a position corresponding to the position AA illustrated in FIG. 12. The cross section of the semiconductor device 110 at a position corresponding to the position BB illustrated in FIG. 12 appears in the same manner as the cross section of the semiconductor device 101 illustrated in FIG. 4. The cross section of the semiconductor device 110 at a position corresponding to the position CC illustrated in FIG. 12 appears in the same manner as the cross section of the semiconductor device 101 illustrated in FIG. 5.

In the semiconductor device 110, the length (thickness) of the first layer 10 along the direction Z decreases as it is away from the gate electrode 8 in the first layer 10 along the direction X, as compared with the semiconductor devices 103 and 105. For example, the position, in the direction Z, of a surface 10e of the first layer 10 opposite to in the direction Z coincides with the position of the surface 8e in the direction Z at the position in contact with the gate electrode 8, and it goes toward the direction Z as it nears the drain electrode 6.

Figure 26:
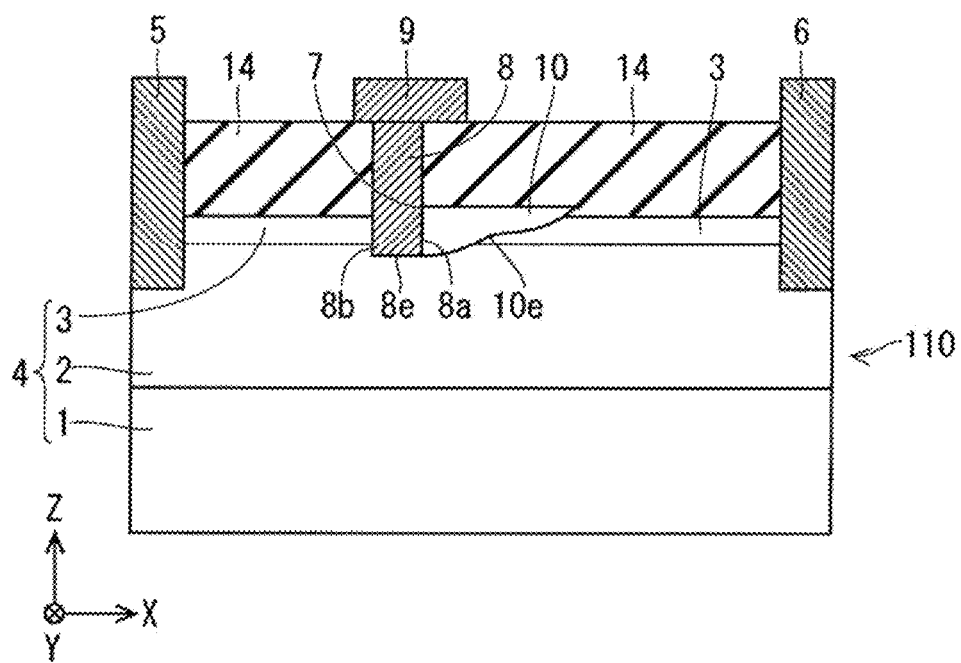
FIG. 26 is a cross-sectional view illustrating a modification structure of a semiconductor device according to the tenth embodiment.

FIG. 26 is a cross-sectional view illustrating a structure of a modification of the semiconductor device 110. FIG. 26 illustrates a cross section of the modification at the same position as the cross section illustrated in FIG. 25. In FIG. 25, the surface 10e has a shape in which the absolute value of the inclination of the surface 10e with respect to the direction X in a cross-sectional view only increases toward the direction X. The surface 10e in FIG. 26 has a portion where the absolute value decreases toward the direction X.

Both the first layer 10 having the cross section illustrated in FIG. 25 and the first layer 10 having the cross section illustrated in FIG. 26 are advantageous from the viewpoint of widening the place where the electric field is concentrated and relaxation of the concentration in the same manner as the semiconductor devices 105 and 106. As the shape of the first layer 10, a shape whose thickness decreases stepwise toward the direction X may be adopted.

A structure in which the thickness of the drain electrode 6 side of the first layer 10 decreases as it is away from the gate electrode 8 can be adoptable to any structure of the semiconductor devices 101 to 109 and contributes to obtaining a large drain current.

The concentration of the electric field is prone to occur at the end of the gate electrode 8 on the drain electrode 6 side, for example, the surface 8a, and not near the two-dimensional electron gas. From this point of view, the variation of the thickness of the first layer 10 not only in the nitride semiconductor layer 2 but also in the nitride semiconductor layer 3 as described above contributes to relaxation of the concentration of the electric field.

Eleventh Embodiment

Figure 27:
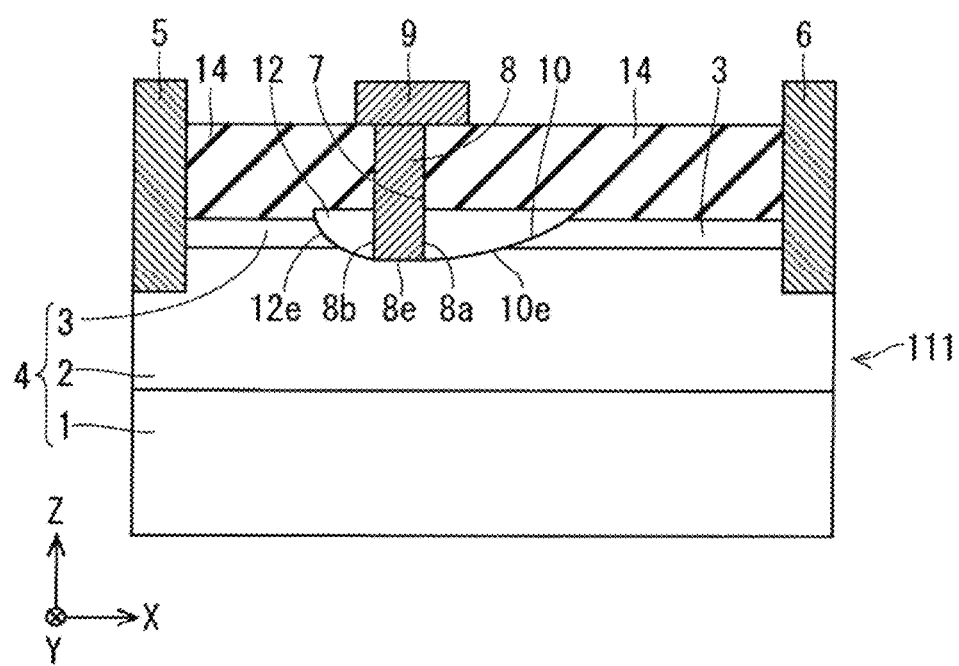
FIG. 27 is a cross-sectional view illustrating a structure of a semiconductor device according to an eleventh embodiment.

FIG. 27 is a cross-sectional view illustrating a structure of a semiconductor device 111 according to an eleventh embodiment. The plan view of the semiconductor device 111 appears in the same manner as the plan view of the semiconductor device 104 according to the fourth embodiment (see FIG. 10). In this case, FIG. 27 illustrates a cross section of the semiconductor device 111 at a position corresponding to the position AA illustrated in FIG. 10. The cross section of the semiconductor device 111 at a position corresponding to the position BB illustrated in FIG. 10 appears in the same manner as the cross section of the semiconductor device 101 illustrated in FIG. 4. The cross section of the semiconductor device 111 at a position corresponding to the position CC illustrated in FIG. 10 appears in the same manner as the cross section of the semiconductor device 101 illustrated in FIG. 5.

Or, the plan view of the semiconductor device 111 appears in the same manner as the plan view of the semiconductor device 106 according to the sixth embodiment (see FIG. 14). In this case, FIG. 27 illustrates a cross section of the semiconductor device 111 at a position corresponding to the position AA illustrated in FIG. 14. The cross section of the semiconductor device 111 at a position corresponding to the position BB illustrated in FIG. 14 appears in the same manner as the cross section of the semiconductor device 101 illustrated in FIG. 4. The cross section of the semiconductor device 111 at a position corresponding to the position CC illustrated in FIG. 14 appears in the same manner as the cross section of the semiconductor device 101 illustrated in FIG. 5.

In the semiconductor device 111, the length (thickness) of the second layer 12 along the direction Z increases as it nears the gate electrode 8 along the direction X, as compared with the semiconductor devices 104 and 106. For example, the position, in the direction Z, of a surface 12e of the second layer 12 opposite to the direction Z coincides with the position of the surface 8e in the direction Z at the position in contact with the gate electrode 8, and it goes toward the direction Z as it nears the source electrode 5.

The second layer 12 having such a cross section is advantageous from the viewpoint of widening the place where the electric field is concentrated and relaxation of the concentration in the same manner as the semiconductor device 106.

As the shape of the second layer 12, a shape whose thickness increases stepwise toward the direction X may be adopted. In FIG. 27, the surface 12e has a shape in which the absolute value of the inclination of the surface 12e with respect to the direction X in a cross-sectional view only decreases toward the direction X. The surface 12e may have a portion where the absolute value increases toward the direction X.

A structure in which the thickness of the source electrode 5 side of the second layer 12 increases as it nears the gate electrode 8 can be adoptable to any structure of the semiconductor devices 101 to 110 and contributes to obtaining a large drain current.

Twelfth Embodiment

In the present embodiment, the first layer 10 is a semiconductor having a conductivity type opposite to the conductivity type of the nitride semiconductor layer 3. For example, the conductivity type of the nitride semiconductor layer 3 is n-type, and a semiconductor having a p-type conductivity type is adopted for the first layer 10. The first layer 10 in which such a semiconductor is adopted is adoptable in any structure of the semiconductor devices 101 to 111.

Figure 28:
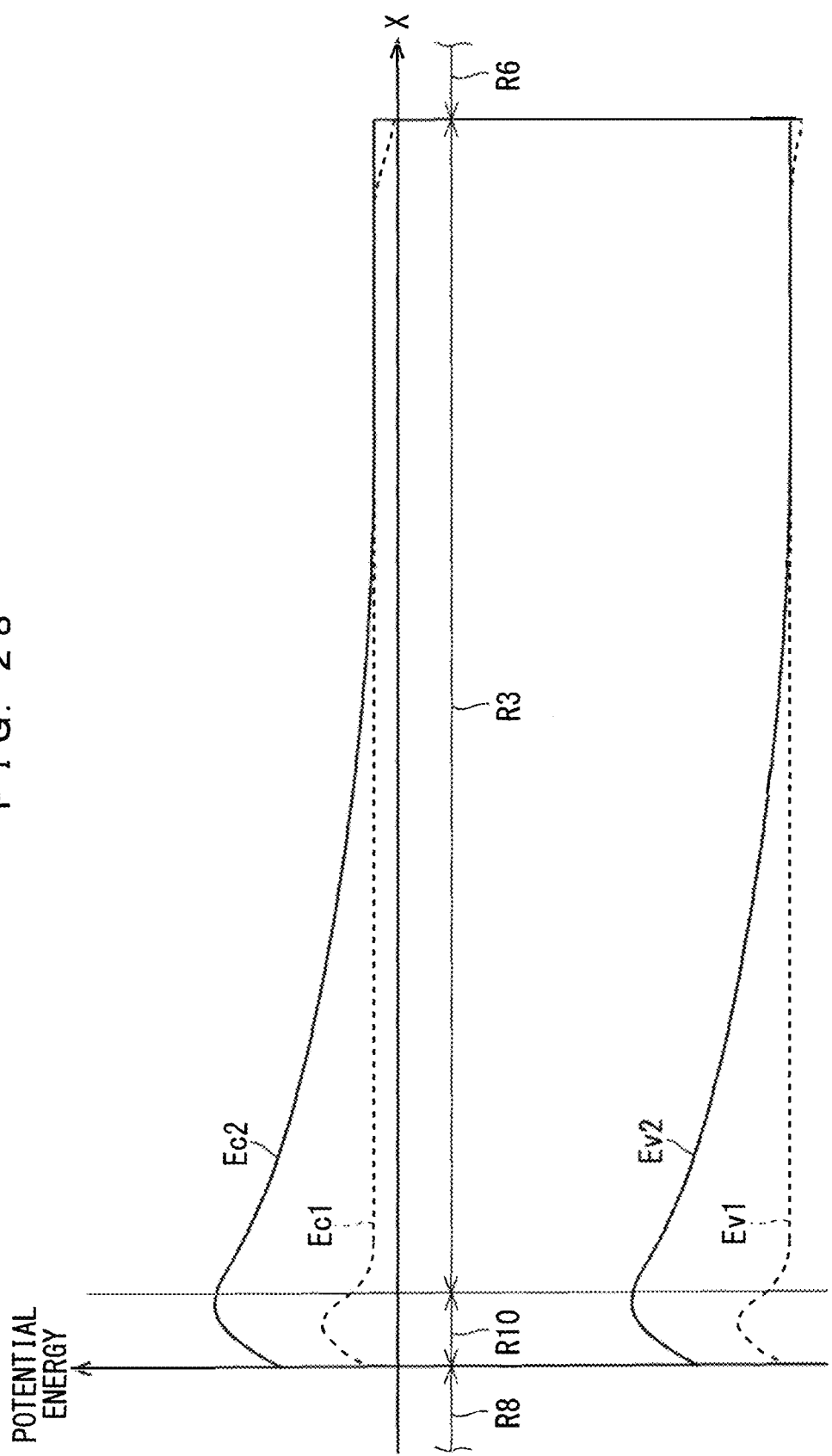
FIG. 28 is a diagram illustrating a band structure of a semiconductor device according to a twelfth embodiment.

FIG. 28 is a diagram illustrating a band structure of a semiconductor device according to a twelfth embodiment. FIG. 28 illustrates the band structure of the nitride semiconductor layer 3 at specific positions in the directions Y and Z. The specific position is the position where the first layer 10 exists in the direction Y, and corresponds to the above-mentioned position AA. The specific position is the position (depth) where the nitride semiconductor layer 3 exists in the direction Z.

On the horizontal axis, a region R8 where the gate electrode 8 exists at the specific position (the boundary opposite to the direction X is omitted), a region R10 where the first layer 10 exists at the specific position, a region R3 where the nitride semiconductor layer 3 exists at the specific position exists, and a region R6 where the drain electrode 6 exists at the specific position (the boundary on the direction X side is omitted) are illustrated. Potential energy for electrons is adopted on the vertical axis.

The bottom Ec1 of the conduction band and the top Ev1 of the valence band of the nitride semiconductor layer 3 are illustrated when the source electrode 5, the drain electrode 6, and the gate electrode 8 have the same potential. The bottom Ec2 of the conduction band and the top Ev2 of the valence band of the nitride semiconductor layer 3 is illustrated when the source electrode 5 and the drain electrode 6 have the same potential and the potential of the gate electrode 8 is positive with respect to the potentials of the source electrode 5 and the drain electrode 6.

When the potential of the gate electrode 8 becomes positive with respect to the potential of the drain electrode 6, the following phenomena occur: holes are implanted from the first layer 10 having a p-type conductivity type to the nitride semiconductor layer 2 having an n-type conductivity type; potentials for holes decreases in nitride semiconductor layer 3; and the implanted holes approach the nitride semiconductor layer 3 which has a low potential for holes and function as a two-dimensional hole gas.

The two-dimensional hole gas functions as a carrier in the drain current in the same manner as the two-dimensional electron gas; therefore, the occurrence of the above-mentioned phenomenon contributes to the increase in the drain current. The increase in the drain current improves the current drive capability and improves the linearity of mutual conductance due to conductivity modulation. The improvement of the linearity of the mutual conductance contributes to the reduction in distortion of the communication system using the semiconductor device according to the present embodiment.

A pn junction is formed at the interface between the first layer 10 and the nitride semiconductor layer 3. The pn junction generates electrostatic capacitance due to the depleted layer and reduces the electrostatic capacitance between the gate electrode 8 and the drain electrode 6. Such reduction in capacitance contributes to at least any of improvement of drain efficiency and improvement of power added efficiency in power conversion using the semiconductor device according to the present embodiment.

Similarly, for both the second layer 12 in the semiconductor devices 102, 104, 106, and 111 and the third layer 13 in the semiconductor device 108, adopting a semiconductor having a conductivity type opposite to the conductivity type of the nitride semiconductor layer 3 allows to obtain either or both of the improvements and contributions described above.

Modifications for Surfaces 8a, 8b, 8c, and 8d

Figure 29:
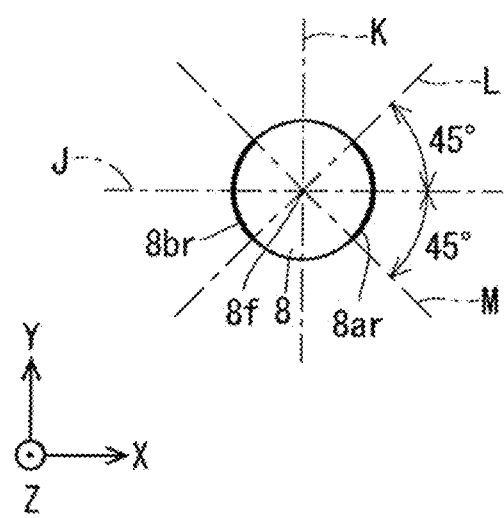
FIG. 29 is a plan view illustrating the gate electrode.

FIG. 29 is a plan view of the gate electrode 8 as viewed along the direction opposite to the direction Z. In FIG. 29, a case where the gate electrode 8 exhibits a circular shape in plan view is illustrated. For example, the gate electrode 8 exhibits a cylinder. The structure of such a gate electrode 8 is disclosed in, for example, Non-Patent Document 1.

The virtual lines J, K, L, and M pass through the center 8f of the gate electrode 8 in plan view. The virtual line J is parallel to the direction X, and is parallel to the direction in which the source electrode 5 and the drain electrode 6 are aligned. The virtual line K is parallel to the direction Y, and is parallel to the direction in which the plurality of gate electrodes 8 are aligned. Both the virtual lines L and M have an inclination of 45 degrees with respect to the directions X and Y. The virtual line L goes to direction Y as it goes to direction X.

The virtual lines L and M are the boundaries of the regions 8ar and 8br of the gate electrode 8. The region 8ar is located more on the direction X side than the region 8br is. In FIG. 29, the regions 8ar and 8br are illustrated by thick lines for better visibility.

For example, the region 8ar is treated as the surface 8a. The first layer 10 is in contact with the gate electrode 8 without extending over the region 8ar. For example, the region 8br is treated as the surface 8b. The second layer 12 is in contact with the gate electrode 8 without extending over the region 8br.

The first layer 10 is in contact with the gate electrode 8 within a range, in a plan view, of 45° or less in both positive and negative to a direction from the source electrode 5 to the drain electrode 6.

The second layer 12 is in contact with the gate electrode 8 within a range, in a plan view, of 45° or less in both positive and negative to the direction from the source electrode 5 to the drain electrode 6.

The embodiments can be combined, appropriately modified or omitted.

While the disclosure has been illustrated and described in detail, the foregoing description is in all aspects illustrative and not restrictive. It is therefore understood that numerous modifications can be devised.

EXPLANATION OF REFERENCE SIGNS

2, 3, 21 to 23, 31 to 33 nitride semiconductor layer, 4 semiconductor layer group, 5 source electrode, 6 drain electrode, 8 gate electrode, 9 conductor, 10 first layer, 12 second layer, 13 third layer, 100 to 111 semiconductor device, X, Y, Z direction.

The invention claimed is:

1. A semiconductor device comprising:
   a semiconductor layer group including a first nitride semiconductor layer and a second nitride semiconductor layer laminated in a first direction;
   a plurality of gate electrodes, each of which being in contact with the second nitride semiconductor layer in a second direction different from the first direction and is arranged along the second direction;
   a conductor electrically connecting the plurality of gate electrodes and located away from the semiconductor layer group;
   a source electrode opposite to the plurality of gate electrodes in a third direction different from both the first direction and the second direction and conducting with the first nitride semiconductor layer;
   a drain electrode opposite to the source electrode via the plurality of gate electrodes in the third direction and conducting with the first nitride semiconductor layer; and
   a first layer located between the plurality of gate electrodes and the drain electrode in the third direction and in contact with the plurality of gate electrodes, and in contact with the second nitride semiconductor layer in the second direction, wherein
   the first nitride semiconductor layer and the second nitride semiconductor layer form a heterojunction, and a two-dimensional carrier gas is induced in the first nitride semiconductor layer,
   the first nitride semiconductor layer and the second nitride semiconductor layer form a Schottky junction with each of the plurality of gate electrodes, and
   the first layer is any of an insulator, an intrinsic semiconductor, and a semiconductor having a conductivity type opposite to that of the second nitride semiconductor layer, and suppresses induction of the two-dimensional carrier gas in the first nitride semiconductor layer opposite to the first layer in the first direction.

2. The semiconductor device according to claim 1, wherein
   the first layer is in contact with the drain electrode.

3. The semiconductor device according to claim 1, wherein
   a length of the first layer is shorter than a distance between the plurality of gate electrodes and the drain electrode in the third direction.

4. The semiconductor device according to claim 1, wherein
   a length of the first layer in the second direction decreases as it is away from the plurality of gate electrodes along the third direction.

5. The semiconductor device according to claim 1, wherein
   a length of the first layer in the first direction decreases as it is away from the plurality of gate electrodes along the third direction.

6. The semiconductor device according to claim 1, further comprising
   a second layer located between the plurality of gate electrodes and the source electrode in the third direction and in contact with the plurality of gate electrodes, wherein
   the second layer is any of an insulator, an intrinsic semiconductor, and a semiconductor having a conductivity type opposite to that of the second nitride semiconductor layer, and suppresses induction of the two-dimensional carrier gas in the first nitride semiconductor layer opposite to the second layer in the first direction.

7. The semiconductor device according to claim 6, wherein
   the second layer is a semiconductor having a conductivity type opposite to that of the second nitride semiconductor layer.

8. The semiconductor device according to claim 6, wherein
   the second layer is in contact with the source electrode.

9. The semiconductor device according to claim 6, wherein a length of the second layer is shorter than a distance between the plurality of gate electrodes and the source electrode in the third direction.

10. The semiconductor device according to claim 6, wherein
a length of the second layer in the second direction increases as it nears the plurality of gate electrodes along the third direction.

11. The semiconductor device according to claim 6, wherein
a length of the second layer in the first direction increases as it nears the plurality of gate electrodes along the third direction.

12. The semiconductor device according to claim 1, wherein
permittivity of the first layer decreases toward the third direction.

13. The semiconductor device according to claim 6, wherein
permittivity of the second layer decreases toward a direction opposite to the third direction.

14. The semiconductor device according to claim 1, further comprising
a third layer located between the plurality of gate electrodes and the first nitride semiconductor layer in the first direction and in contact with the plurality of gate electrodes, wherein
the third layer is an insulator or a semiconductor having a conductivity type opposite to that of the second nitride semiconductor layer.

15. The semiconductor device according to claim 1, wherein
the semiconductor layer group includes a plurality of the first nitride semiconductor layers and a plurality of the second nitride semiconductor layers alternately laminated in the first direction.

16. The semiconductor device according to claim 1, wherein
each of the plurality of gate electrodes extends through the second nitride semiconductor layer and is in contact with the first nitride semiconductor layer.

17. The semiconductor device according to claim 1, wherein
the first layer extends through the second nitride semiconductor layer and is in contact with the first nitride semiconductor layer.

18. The semiconductor device according to claim 17, wherein
the first layer exists on the opposite side of the first direction from a position of the induced two-dimensional carrier gas in the first direction.

19. The semiconductor device according to claim 6, wherein
the second layer extends through the second nitride semiconductor layer and is in contact with the first nitride semiconductor layer.

20. The semiconductor device according to claim 19, wherein
the second layer exists on the opposite side of the first direction from a position of the induced two-dimensional carrier gas in the first direction.

* * * * *